United States Patent
Yu et al.

(10) Patent No.: US 11,180,585 B2
(45) Date of Patent: Nov. 23, 2021

(54) FILM TOUCH SENSOR AND STRUCTURE INCLUDING THE SAME

(71) Applicant: DONGWOO FINE-CHEM CO., LTD., Jeollabuk-do (KR)

(72) Inventors: Byung Muk Yu, Gyeonggi-do (KR); Min Hyuk Park, Gangwon-do (KR); Myung Young An, Incheon (KR)

(73) Assignee: DONGWOO FINE-CHEM CO., LTD., Jeollabuk-do (KR)

( * ) Notice: Subject to any disclaimer, the term of this patent is extended or adjusted under 35 U.S.C. 154(b) by 467 days.

(21) Appl. No.: 16/326,511

(22) PCT Filed: May 16, 2017

(86) PCT No.: PCT/KR2017/005033
§ 371 (c)(1),
(2) Date: Feb. 19, 2019

(87) PCT Pub. No.: WO2018/034411
PCT Pub. Date: Feb. 22, 2018

(65) Prior Publication Data
US 2021/0277156 A1    Sep. 9, 2021

(30) Foreign Application Priority Data

Aug. 19, 2016 (KR) .......... 10-2016-0105263

(51) Int. Cl.
*B32B 7/12* (2006.01)
*C08F 20/20* (2006.01)
(Continued)

(52) U.S. Cl.
CPC ................ *C08F 20/20* (2013.01); *B32B 7/10* (2013.01); *B32B 7/12* (2013.01); *C08F 12/08* (2013.01); *C08F 20/14* (2013.01); *C08F 20/40* (2013.01); *G02B 1/18* (2015.01); *G06F 3/041* (2013.01); *G06F 3/0443* (2019.05); *H01B 5/14* (2013.01); *B32B 2457/208* (2013.01); *G06F 2203/04102* (2013.01)

(58) Field of Classification Search
CPC .......... C08F 20/20; C08F 12/08; C08F 20/14; C08F 20/40; G06F 3/0443; G06F 3/041;
(Continued)

(56) References Cited

U.S. PATENT DOCUMENTS

2008/0012163 A1    1/2008    Andrews et al.
2016/0209551 A1*   7/2016    Bekku ..................... G02B 1/18

FOREIGN PATENT DOCUMENTS

CN    102576855 A    7/2012
CN    107003763 A    8/2017
(Continued)

OTHER PUBLICATIONS

International Search Report for PCT/KR2017/005033 dated Sep. 28, 2017.
(Continued)

*Primary Examiner* — Abdul-Samad A Adediran
(74) *Attorney, Agent, or Firm* — The PL Law Group, PLLC

(57) ABSTRACT

A film touch sensor is prepared by performing a process in which a separation layer made of a specific component is formed on a carrier substrate, and an insulation film is formed on a transparent conductive film pattern, which is used as a planarization layer, an adhesive layer or a base layer.

20 Claims, 5 Drawing Sheets

(51) Int. Cl.
  *H01B 5/14* (2006.01)
  *C08F 20/40* (2006.01)
  *G06F 3/041* (2006.01)
  *C08F 12/08* (2006.01)
  *G06F 3/044* (2006.01)
  *C08F 20/14* (2006.01)
  *B32B 7/10* (2006.01)
  *G02B 1/18* (2015.01)

(58) Field of Classification Search
  CPC ....... B32B 7/10; B32B 2457/208; H01B 5/14; G02B 1/18
  See application file for complete search history.

(56) References Cited

FOREIGN PATENT DOCUMENTS

| | | |
|---|---|---|
| JP | 2014-091774 A | 5/2014 |
| JP | 2015-127389 A | 7/2015 |
| KR | 10-1191865 B1 | 10/2012 |
| KR | 10-1586739 B1 | 1/2016 |
| KR | 10-2016-0073735 A | 6/2016 |
| KR | 10-2016-0091764 A | 8/2016 |
| TW | 201606599 A | 2/2016 |
| TW | 201624229 A | 7/2016 |
| WO | WO 2011/028251 A2 | 3/2011 |
| WO | 2016/122116 A1 | 8/2016 |

OTHER PUBLICATIONS

Office action dated Oct. 22, 2018 from Korean Patent Office in a counterpart Korean Patent Application No. 10-2016-0105263 (all the cited references are listed in this IDS.).

Office action dated Sep. 3, 2019 from China Patent Office in a counterpart China Patent Application No. 201780050463.0 (all the cited references are listed in this IDS.) (English translation is also submitted herewith.).

* cited by examiner

FILM TOUCH SENSOR AND STRUCTURE INCLUDING THE SAME

CROSS REFERENCE TO RELATED APPLICATIONS AND CLAIM OF PRIORITY

This application claims benefit under 35 U.S.C. 119(e), 120, 121, or 365(c), and is a National Stage entry from International Application No. PCT/KR2017/005033, filed on May 16, 2017, which claims priority to the benefit of Korean Patent Application No. 10-2016-0105263 filed in the Korean Intellectual Property Office on Aug. 19, 2016, the entire contents of which are incorporated herein by reference.

BACKGROUND OF THE INVENTION

1. Field of the Invention

The present invention relates to a film touch sensor and a structure including the film touch sensor.

2. Description of the Related Art

Attempts are being made to introduce a touch input type into a wider variety of electronic devices due to the touch input type being in the spotlight as a next-generation input type. Accordingly, research and development for a touch sensor capable of being applied to different environments and accurately recognizing a touch have been actively executed.

For example, in a case of the electronic device having a touch input type display, an ultrathin flexible display which achieves an ultralight and a low power consumption with improved portability is in the spotlight as a next-generation display, and thus the development for a touch sensor applicable to such a display is required.

The flexible display refers to a display fabricated on a flexible substrate which is capable of being bent, folded, or warped having no reduction in operational characteristics, and techniques thereof have been developed in a form such as flexible LCDs, flexible OLEDs, electronic papers, and the like.

In order to apply the touch input type to such the flexible display, a touch sensor having excellent bendability and restoring force, as well as superior flexibility and elasticity is required.

In regard to a film touch sensor for fabricating such the flexible display, a wiring substrate including wirings buried in a transparent resin base film has been proposed.

A method for fabricating a film touch sensor includes: a wiring formation process of forming metal wirings on a substrate, a lamination process of applying a transparent resin solution to the substrate and drying to form a transparent resin base film so as to cover the metal wirings, and a peeling-off process of peeling-off the transparent resin base film from the substrate.

In order to smoothly perform the peeling-off process, the above-described fabrication method uses a method in which an organic peeling-off agent such as a silicone resin or a fluorine resin; or an inorganic peeling-off agent such as a diamond-like carbon (DLC) thin film or a zirconium oxide thin film is formed on a surface of the substrate in advance.

However, in a case of using the inorganic peeling-off agent in the above method, when peeling-off the base film and the metal wirings from the substrate, the metal wirings and the base film are not smoothly peeled-off therefrom, such that a portion of the metal wirings or the base film is remained on the surface of the substrate, and an organic material used as the peeling-off agent comes out on the metal wirings and the surface of the base film.

That is, there is a problem that, even if using the peeling-off agent, the metal wirings of a wiring substrate cannot be completely peeled-off from the substrate.

In order to solve the above-described problems, Korean Patent Registration Publication No. 10-1191865 discloses a method in which, in a step of fabricating a flexible substrate of a form having metal wirings buried therein, a sacrificial layer capable of being removed by light or a solvent, metal wirings and a polymer material (flexible substrate) are formed on a substrate, and the sacrificial layer is removed by using the light or solvent, and thereby the metal wirings and the polymer material (flexible substrate) are removed from the substrate.

However, the above-described method has problems that, in a case of having a large size, it is difficult to remove the sacrificial layer in the removing process thereof, and various types of base film may not be used because performing a high-temperature process is impossible.

SUMMARY

An object of the present invention is to provide a film touch sensor prepared by performing a process in which a separation layer made of a specific component capable of preventing an occurrence of electrode damage and cracks while providing excellent peelability is formed on a carrier substrate, so that the separation layer is used as a wiring cover layer when separating from the carrier substrate, and a structure including the film touch sensor.

In addition, another object of the present invention is to provide a film touch sensor in which a touch sensor is implemented on a carrier substrate so as to secure high accuracy and heat resistance which are impossible in a process of directly implementing the touch sensor on a base film, and diversify the base film, and a structure including the film touch sensor.

Further, another object of the present invention is to provide a film touch sensor prepared by performing a process in which a separation layer made of a specific component having controlled peel-off strength and thickness is formed on a carrier substrate, and the separation layer is not removed even after separating from the carrier substrate, thus a separate process of removing the separation layer is not required, and a structure including the film touch sensor.

The above objects of the present invention will be achieved by the following characteristics:

(1) A film touch sensor including: a separation layer; an electrode pattern layer which is formed on the separation layer, and includes a sensing electrode and a pad electrode formed on one end of the sensing electrode; and an insulation layer formed on a top of the electrode pattern layer so as to cover a part or all of the electrode pattern layer, wherein the separation layer includes a chain polymer including a side chain having an alcoholic secondary or tertiary hydroxyl group, and a cross-linking agent, and the side chain is made of a curable resin composition which has 3 to 30 carbon atoms, includes at least one saturated or unsaturated hydrocarbon group, or further includes at least one aromatic group, and has a bond selected from a group consisting of —COO—, —O—, and —CO— connecting the carbon atoms with each other.

(2) The film touch sensor according to the above (1), wherein the chain polymer includes, as a monomer unit including the side chain having an alcoholic secondary or tertiary hydroxyl group, at least one of a (meth)acrylate monomer, a vinylester monomer, a vinylether monomer, and other vinyl monomers in addition thereto.

(3) The film touch sensor according to the above (1), wherein the chain polymer includes a monomer unit selected from a group consisting of compounds represented by formulae of $CH_2=CH-COO-R^1$, $CH_2=C(CH_3)-COO-R^2$, $CH_2=CH-O-CO-R^3$, $CH_2=CH-O-R^4$, and $CH_2=CH-R^5$, and $R^1$, $R^2$, $R^3$, $R^4$ and $R^5$ are each independently, when they are bonded to each vinyl group through an ester bond, has 3 to 30 carbon atoms including carbon atoms constituting the ester bond, has an alcoholic secondary or tertiary hydroxyl group, includes at least one saturated or unsaturated hydrocarbon group, or further includes at least one aromatic group, and has a bond selected from a group consisting of —COO—, —O—, and —CO— connecting the carbon atoms with each other.

(4) The film touch sensor according to the above (1), wherein the chain polymer includes, as an additional monomer unit, at least one of a (meth)acrylate monomer, a vinylester monomer, a vinylether monomer, which have 1 to 15 carbon atoms in the side chain while having no hydroxyl group, and other vinyl monomers in addition thereto.

(5) The film touch sensor according to the above (4), wherein the additional monomer unit is selected from a group consisting of compounds represented by formulae of $CH_2=CH-COO-R^6$, $CH_2=C(CH_3)-COO-R^7$, $CH_2=CH-O-CO-R^8$ (wherein $R^6$, $R^7$ and $R^8$ each independently have 1 to 15 carbon atoms while having no hydroxyl group, includes at least one saturated or unsaturated hydrocarbon group, or further includes at least one aromatic group, and has a bond selected from a group consisting of —COO—, —O— and —CO— connecting the carbon atoms with each other, and the hydrocarbon group or the aromatic group has an amino group), $CH_2=CH-O-R^9$, $CH_2=CH-R^{10}$ (wherein $R^9$ and $R^{10}$ each independently have 1 to 15 carbon atoms while having no hydroxyl group, includes at least one saturated or unsaturated hydrocarbon group, or further includes at least one aromatic group, and has a bond selected from a group consisting of —COO—, —O— and —CO— connecting the carbon atoms with each other, and the hydrocarbon group or the aromatic group has an amino group), $C_4HO_3-R^{11}$ and $C_4H_2NO_2-R^{12}$ (wherein $C_4HO_3$— represents a maleic anhydride group, $C_4H_2NO_2$— represents a maleimide group, and $R^{11}$ and $R^{12}$ are each independently a hydrogen atom or has 1 to 15 carbon atoms while having no hydroxyl group, includes at least one saturated or unsaturated hydrocarbon group, or further includes at least one aromatic group, and has a bond selected from a group consisting of —COO—, —O— and —CO— connecting the carbon atoms with each other, and the hydrocarbon group or the aromatic group has an amino group).

(6) The film touch sensor according to the above (1), wherein a ratio of the monomer unit having an alcoholic secondary or tertiary hydroxyl group to the monomer unit constituting the chain polymer is 30 to 100 mol %.

(7) The film touch sensor according to the above, wherein the cross-linking agent is selected from a triazine cross-linking agent and a glycoluril cross-linking agent.

(8) The film touch sensor according to the above (1), wherein the cross-linking agent is selected from a group consisting of fully or partially alkoxy-methylated melamine, fully or partially alkoxy-methylated guanamine, fully or partially alkoxy-methylated acetoguanamine, fully or partially alkoxy-methylated benzoguanamine, and fully or partially alkoxy-methylated glycoluril.

(9) The film touch sensor according to the above (1), wherein a weight ratio of the chain polymer to the cross-linking agent in the curable resin composition is 1:0.05 to 2.

(10) The film touch sensor according to the above (1), wherein a weight ratio of the chain polymer to the cross-linking agent in the curable resin composition is 1:0.5 to 2.

(11) The film touch sensor according to the above (1), wherein the curable resin composition includes a solvent.

(12) The film touch sensor according to the above (1), further including a protective layer formed between the separation layer and the electrode pattern layer.

(13) The film touch sensor according to the above (1), further including an optical film disposed on a top of the insulation layer.

(14) The film touch sensor according to the above (1), wherein the electrode pattern layer is made of at least one selected from a group consisting of metal, metal nanowires, metal oxides, carbon nanotubes, graphene, conductive polymer, and a conductive ink.

(15) The film touch sensor according to the above (1), wherein the separation layer is formed on a carrier substrate with being separated from the carrier substrate after formation thereof.

(16) The film touch sensor according to the above (15), wherein the separation layer has a peel-off strength of 1 N/25 mm or less when separating from the carrier substrate.

(17) The film touch sensor according to the above (15), wherein the carrier substrate is a glass substrate.

(18) The film touch sensor according to the above (1), further including a functional film layer formed on a surface of the separation layer opposite to the surface on which the electrode pattern layer is formed through an adhesive agent or a bonding agent.

(19) The film touch sensor according to the above (18), wherein the functional film layer is at least one functional film selected from a group consisting of a transparent film, a retardation film, an isotropic film, a protective film, a polarizing plate, a polarizer, and a barrier film.

(20) The film touch sensor according to the above (18), wherein the functional film layer is a film on which a functional coating layer is formed on a base film, and the functional coating layer is a coating type organic film layer, a coating type retardation layer, a coating type polarizer layer, or a coating type alignment film layer.

(21) A structure including a film touch sensor, including: a carrier substrate; a separation layer formed on the carrier substrate; an electrode pattern layer which is formed on the separation layer, and includes a sensing electrode and a pad electrode formed on one end of the sensing electrode; and an insulation layer formed on a top of the electrode pattern layer so as to cover a part or all of the electrode pattern layer, wherein the separation layer includes a chain polymer including a side chain having an alcoholic secondary or tertiary hydroxyl group, and a cross-linking agent, and the side chain is made of a curable resin composition which has 3 to 30 carbon atoms, includes at least one saturated or unsaturated hydrocarbon group, or further includes at least one aromatic group, and has a bond selected from a group consisting of —COO—, —O—, and —CO— connecting the carbon atoms with each other.

(22) The structure according to the above (21), wherein the cross-linking agent is selected from a triazine cross-linking agent and a glycoluril cross-linking agent.

(23) The structure according to the above (21), further including a protective layer formed between the separation layer and the electrode pattern layer.

According to the present invention, it is possible to increase process efficiency of manufacturing the touch sensor by forming an insulation layer used as a planarization layer, an adhesive layer, or a base layer on a transparent conductive film pattern.

According to the present invention, it is possible to increase the process efficiency and productivity by performing a process in which the separation layer made of a specific component capable of preventing an occurrence of electrode damage and cracks while providing excellent peelability is formed on a carrier substrate, so that the separation layer is used as a wiring cover layer when separating from the carrier substrate.

According to the present invention, it is possible to secure high accuracy and heat resistance by performing a process of implementing the touch sensor on the carrier substrate, and diversify the base film.

According to the present invention, a process of removing the separation layer after separating from the carrier substrate is not performed, thereby simplifying the process and solving the problems applied to the touch sensor region in the removing process.

According to the present invention, it is possible to suppress an occurrence of curl generated in the film touch sensor after separating from the carrier substrate.

According to the present invention, the film touch sensor may include a transparent thin film (for example, having a thickness of several hundred nanometers) capable of being easily peeled-off without difficulty, which is obtained by applying a specific curable composition to the carrier substrate and curing the same. Further, the thin film formed on the substrate as described above is able to withstand heating up to 150° C., preferably also able to withstand heating up to 230° C. Furthermore, the film touch sensor has become resistant to the solvent used in a photoresist solution, and is also resistant to an alkaline developing solution, such that it can be advantageously used as a resin base film for manufacturing a circuit by photolithography. In addition, since the thin film formed according to the present invention has an easy peelability even after heating at such a temperature, it is possible to provide a process of manufacturing a circuit including a calcination step at a higher temperature than ever before in spite of having a thin thickness, and thereby, it is advantageous in terms of preserving characteristics of the circuit. Further, since the thin film can be easily peeled-off without difficulty, it is possible to provide a touch sensor or a touch sensor structure having excellent peel-off strength and crack suppressing properties.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

Figure 1:
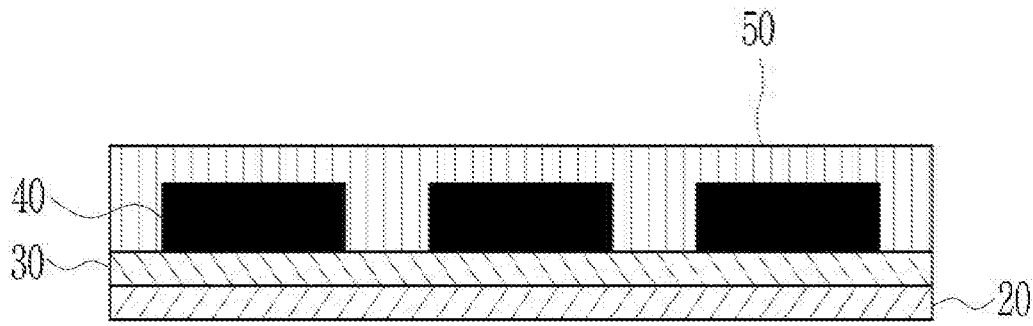
FIGS. 1 to 4 are cross-sectional views illustrating a structure of a film touch sensor according to an embodiment of the present invention.

According to one embodiment of the present invention, there is provided a film touch sensor including: a separation layer; an electrode pattern layer which is formed on the separation layer, and includes a sensing electrode and a pad electrode formed on one end of the sensing electrode; and an insulation layer formed on a top of the electrode pattern layer so as to cover a part or all of the electrode pattern layer, wherein the separation layer includes a chain polymer including a side chain having an alcoholic secondary or tertiary hydroxyl group, and a cross-linking agent, and the side chain is made of a curable resin composition which has 3 to 30 carbon atoms, includes at least one saturated or unsaturated hydrocarbon group, or further includes at least one aromatic group, and has a bond selected from a group consisting of —COO—, —O—, and —CO— connecting the carbon atoms with each other. Therefore, by performing a process in which the separation layer made of a specific component capable of preventing an occurrence of electrode damage and cracks while providing excellent peelability is formed on the carrier substrate, so that the separation layer is used as a wiring cover layer when separating from the carrier substrate, and thereby securing high accuracy and heat resistance which are impossible in a process of directly implementing the touch sensor on a base film, and diversifying the base film.

According to the present invention, a process, in which a separation layer made of a specific component capable of preventing an occurrence of electrode damage and cracks while providing excellent peelability is formed on a carrier substrate, is performed, and then an insulation film may be formed thereon, so as to be used as an adhesive layer for adhering a film in subsequent processes, or as an optical (film) layer or a planarization layer. The insulation layer used as the planarization layer prevents corrosion of the electrode pattern, and since the surface is planarized, it is possible to inhibit an occurrence of microbubbles during adhering with a base film through an adhesive agent or a bonding agent.

In the present invention, when there is a repeating unit, compound or isomer of a resin represented by formulae, the repeating unit, compound or resin represented by the formulae refers to a representative formula including the isomer.

In present invention, the respective repeat units represented in first and second resins are duly not construed as being limited only to the representation of the formulae. Instead, sub-repeat units in the parenthesis may be freely positioned at any site in a chain within a predetermined range of mol %. That is, although the parenthesis in each of formulae was indicated in a form of block to express mol %, each sub-repeat unit may be represented as a block or positioned separately without any particular limitation if the sub-repeat unit is present within the corresponding resin.

As used herein, the term "heat resistance" refers to that a film obtained by curing the curable resin composition is able to withstand heating up to 150° C., preferably also able to withstand heating up to 230° C., such that decomposition or other deterioration does not substantially occur. The temperature of 230° C. is a high temperature enough to be used as the calcination temperature in the manufacture of electronic circuits by photolithography.

As used herein, the term "easy peeling-off film" refers to that a film formed by applying to a substrate, particularly, to a glass substrate and curing the same can be easily peeled-off from the substrate without breaking the film (that is, without difficulty), and the term "easy peelability" refers to properties of such a film. Examples of the glass substrate include suitable glass substrates such as a soda glass substrate, an alkali-free glass substrate, and the like. The soda glass substrate is a particularly preferable example.

As used herein, a width of the "cured resin film" is not particularly limited. When using as a base film for manufacturing the circuits, a preferable thickness of the cured resin film is 200 to 400 nm, for example, about 300 nm. This range is a thickness for corresponding to the request of the current film thickness reduction, and the performance of the cured resin film itself is not limited to this thickness range, thus the thickness of the cured resin film is randomly defined.

Hereinafter, specific embodiments of the present invention will be described with reference to the accompanying drawings. But, these are only an example, and the present invention is not limited thereto.

A separation layer 20 according to the present invention is made of the following curable resin composition.

The curable resin composition includes a chain polymer including a side chain having an alcoholic secondary or tertiary hydroxyl group; and a cross-linking agent.

(A) The side chain is made of a curable resin composition which has 3 to 30 carbon atoms, includes at least one saturated or unsaturated hydrocarbon group, or further includes at least one aromatic group, and has a bond selected from a group consisting of —COO—, —O—, and —CO— connecting the carbon atoms with each other.

As necessary, (b) the cross-linking agent may be selected from a triazine cross-linking agent, and a glycoluril cross-linking agent.

The film formed by the curable resin of the present invention may be heat resistant in the above-described sense, and may have easy peelability even after performing heat treatment in a temperature range of heat resistance conditions.

The chain polymer, which is one of the components of the curable resin composition of the present invention, includes a side chain having an alcoholic secondary or tertiary hydroxyl group. As used herein, the term "side chain" refers to a structural portion branched from a main chain, and the term "main chain" refers to a chain composed of atoms connected in a one-dimensional direction of repeating monomer units in the structure of the polymer. Accordingly, for example, when the polymer is a polymer of (meth)acrylate, "—COO—", which is a moiety involved in forming an ester bond in each monomer, is included in a portion of the "side chain." Meanwhile, the notation of the "(meth)acrylate" indicates acrylate and methacrylate without distinction.

In the present invention, the number of carbon atoms contained in the side chain having an alcoholic secondary or tertiary hydroxyl group of the chain polymer is preferably 3 to 30. In the side chain having an alcoholic secondary or tertiary hydroxyl group, the number of the hydroxyl groups may be one or two or more.

The side chain has carbon atoms, includes at least one saturated or unsaturated hydrocarbon group, or further includes at least one aromatic group. The side chain may include one or two or more bonds selected from a group consisting of —COO—, —O— and —CO— connecting the carbon atoms with each other. The saturated or unsaturated hydrocarbon group included in the side chain may occupy, for example, all the carbon atoms of the side chain alone, or a plurality of saturated or unsaturated carbon groups may be connected with each other through a bond selected from a group consisting of —COO—, —O— and —CO—. When the side chain includes an aromatic group in addition to the saturated or unsaturated hydrocarbon group, the saturated or unsaturated hydrocarbon group and the aromatic group may be directly bonded or may be connected through the bond selected from a group consisting of —COO—, —O— and —CO—. As used herein, when referring to "—O—" and "—CO—", it does not include a case in which they are a constitutive moiety of "—COO—."

In the present invention, the alcoholic secondary and tertiary hydroxyl groups of the side chain are a substantial decisive element necessary for the cured resin thin film formed by applying the curable resin composition of the present invention to a glass substrate and curing the same to maintain the easy peelability from the substrate even after the calcination. The chain polymer having such a side chain may provide an easy peeling-off film having heat resistance when using a resin composition with a suitable cross-linking agent, particularly any one of a triazine cross-linking agent and a glycoluril cross-linking agent, and curing the same in a form of a thin film.

In the present invention, it is preferable that the chain polymer including the side chain having an alcoholic secondary or tertiary hydroxyl group includes a (meth)acrylate monomer, a vinylester monomer, a vinylether monomer, and at least one of vinyl monomers other than the above-described monomers as a monomer unit.

More preferably, the chain polymer of the present invention includes a monomer unit selected from a group consisting of compounds represented by formulae of $CH_2=CH—COO—R^1$, $CH_2=C(CH_3)—COO—R^2$, $CH_2=CH—O—CO—R^3$, $CH_2=CH—O—R^4$ and $CH_2=CH—R^5$ (wherein $R^1$, $R^2$, $R^3$, $R^4$ and $R^5$ are each independently, when they are bonded to each vinyl group through an ester bond, has 3 to 30 carbon atoms, preferably, 3 to 25, and more preferably 3 to 20, contains an alcoholic secondary or tertiary hydroxyl group, includes at least one saturated or unsaturated hydrocarbon group, or further includes at least one aromatic group, and has a bond selected from a group consisting of —COO—, —O—, and —CO- connecting the carbon atoms with each other).

Herein, examples of the saturated or unsaturated hydrocarbon group may include methyl, ethyl, n-propyl, isopropyl, butyl, pentyl, hexyl, cyclohexyl, dicyclopentadienyl, decarinyl, adamantyl, butenyl, hexenyl, cyclohexenyl, decyl, and other various straight chain, branched chain, monocyclic and condensed cyclic groups within a limit range of the number of carbon atoms in the side chain, but it is not limited thereto. When the respective groups are not located at the terminal, they may be divalent groups or more in accordance with the coupling relationship with other groups. Examples of the aromatic group may include a monocyclic aromatic group (monocyclic group and condensed cyclic group) such as phenyl, biphenyl, and naphthyl, etc.; and a heteroaromatic group (monocyclic group and condensed cyclic group) such as pyridyl, pyrimidinyl, quinolinyl, and triazinyl, etc. For each aromatic group, when the respective groups are not located at the terminal, they may be divalent groups or more in accordance with the coupling relationship with other groups. Meanwhile, as used herein, a group having a saturated or unsaturated hydrocarbon chain portion forming a ring together with an aromatic ring portion (for example, tetrahydronaphthyl or dihydronaphthyl) may be confirmed based on a bond of the aromatic group with the saturated or unsaturated hydrocarbon group.

In the present invention, the alcoholic secondary or tertiary hydroxyl group is a hydroxyl group substituted with a hydrogen atom on any one of secondary and tertiary carbon atoms of a saturated or unsaturated hydrocarbon group included in the side chain.

Preferable side chain having an alcoholic secondary or tertiary hydroxyl group of the chain polymer of the present invention may include the following types, but it is not limited thereto, and other type side chains may be used so long as they have such a hydroxy group.

(1a) A-O—CO-type (A represents the remaining portion of the side chain, which will be identically applied below) side chain: 2-hydroxypropoxycarbonyl, 2-hydroxy-3-(cyclohexylcarbonyloxy)propoxycarbonyl, 3-benzoyloxy-2-hydroxypropoxycarbonyl, 4-benzoyloxy-3-hydroxycyclohexylmethoxycarbonyl, 3-hydroxy-1-adamantyloxycarbonyl, 2-hydroxycyclohexyloxycarbonyl, 4-undecanoyloxy-3-hydroxycyclohexylmethoxycarbonyl, 4-butanoyloxy-3-hydroxycyclohexylmethoxycarbonyl, and the like.

(2a) A-CO—O-type side chain: 2-hydroxypropylcarbonyloxy, 2-hydroxy-3-(cyclohexylcarbonyloxy) propylcarbonyloxy, 3-benzoyloxy-2-hydroxycyclohexylcarbonyloxy, 4-benzoyloxy-3-hydroxycyclohexylmethylcarbonyloxy, 3-hydroxy-1-adamantylcarbonyloxy, 2-hydroxycyclohexyloxycarbonyloxy, 4-undecanoyloxy-3-hydroxycyclohexylmethylcarbonyloxy, 4-butanoyloxy-3-hydroxycyclohexylmethylcarbonyloxy, and the like.

(3a) A-O-type side chain: 2-hydroxypropoxy, 2-hydroxy-3-(cyclohexylcarbonyloxy)propoxy, 3-benzoyloxy-2-hydroxypropoxy, 4-benzoyloxy-3-hydroxycyclohexylmethoxy, 3-hydroxy-1-adamantyloxy, 2-hydroxycyclohexyloxy, 4-undecanoyloxy-3-hydroxycyclohexylmethoxy, 4-butanoyloxy 3-hydroxycyclohexylmethoxy, and the like.

(4a) Others: 2-hydroxypropyl, 2-hydroxy-3-(cyclohexylcarbonyloxy) propyl, 3-benzoyloxy-2-hydroxypropyl, 4-benzoyloxy-3-hydroxycyclohexylmethyl, 3-hydroxy-1-adamantyl, 2-hydroxycyclohexyl, 4-undecanoyloxy-3-hydroxycyclohexylmethyl, 4-butanoyloxy-3-hydroxycyclohexylmethyl, and the like.

Preferable examples of the monomer for providing these side chains to the chain polymer may include the following compounds, but it is not limited thereto.

(1b) (Meth)acrylates such as 2-hydroxypropyl (meth)acrylate, 2-hydroxy-3-(cyclohexylcarbonyloxy)propyl (meth)acrylate, 3-benzoyloxy-2-hydroxypropyl (meth)acrylate, 4-benzoyloxy-3-hydroxycyclohexylmethyl (meth)acrylate, 1,3-adamantyldiol mono(meth)acrylate, 2-hydroxycyclohexyl (meth)acrylate, 4-undecanoyloxy-3-hydroxycyclohexylmethyl (meth)acrylate, 4-butanoyloxy-3-hydroxycyclohexylmethyl (meth)acrylate, and the like.

(2b) Vinylesters such as 2-hydroxy butanaoic acid vinylester, 2-hydroxy-3-(cyclohexylcarbonyloxy) butanaoic acid vinylester, 3-benzoyloxy-2-hydroxy butanaoic acid vinylester, 4-benzoyloxy-3-hydroxycyclohexyl acetic acid vinylester, 3-hydroxy-1-adamantyl carboxylic acid vinylester, 2-hydroxycyclohexyloxy carboxylic acid vinylester, 4-undecanoyloxy-3-hydroxycyclohexyl acetic acid vinylester, 4-butanoyloxy-3-hydroxycyclohexyl acetic acid vinylester, and the like.

(3b) Vinylethers such as 2-hydroxypropyl vinylether, 2-hydroxy-3-(cyclohexylcarbonyloxy)propyl vinylether, 3-benzoyloxy-2-hydroxypropyl vinylether, 4-benzoyloxy-3-hydroxycyclohexylmethyl vinylether, 3-hydroxy-1-adamantyl vinylether, 2-hydroxycyclohexyl vinylether, 4-undecanoyloxy-3-hydroxycyclohexylmethyl ether, 4-butanoyloxy 3-hydroxycyclohexylmethyl ether, and the like.

(4b) Vinyl monomers such as 1-penten-4-ol, 4-hydroxy-5-(cyclohexylcarbonyloxy)-1-pentene, 5-benzoyloxy-4-hydroxy-1-pentene, 3-(4-benzoyloxy-3-hydroxycyclohexyl)-1-propene, (3-hydroxy-1-adamantyl)ethene, (2-hydroxycyclohexyl)ethene, 3-(4-undecanoyloxy-3-hydroxycyclohexyl)-1-propene, 3-(4-butanoyloxy-3-hydroxycyclohexyl)-1-propene, and the like.

(5b) Maleic anhydride and maleimide having the above (1a) to (4a) as a substituent, respectively.

The chain polymer of the present invention may include, in addition to the above-described monomer having an alcoholic secondary or tertiary hydroxyl group, at least one of a (meth)acrylate monomer, a vinylester monomer, a vinylether monomer, which have 1 to 15 carbon atoms in the side chain while having no hydroxyl group, and other vinyl monomers in addition thereto, as an additional monomer unit. Such the additional monomer unit may be selected from a group consisting of compounds represented by formulae of $CH_2=CH—COO—R^6$, $CH_2=C(CH_3)—COO—R^7$, $CH_2=CH—O—CO—R^8$ (wherein $R^6$, $R^7$ and $R^8$ each independently have 1 to 15 carbon atoms while having no hydroxyl group, includes at least one saturated or unsaturated hydrocarbon group, or further includes at least one aromatic group, and may have a bond selected from a group consisting of —COO—, —O— and —CO— connecting the carbon atoms with each other, and the hydrocarbon group or the aromatic group may have an amino group), $CH_2=CH—O—R^9$, $CH_2=CH—R^{10}$ (wherein $R^9$ and $R^{10}$ each independently have 1 to 15 carbon atoms while having no hydroxyl group, includes at least one saturated or unsaturated hydrocarbon group, or further includes at least one aromatic group, and may have a bond selected from a group consisting of —COO—, —O— and —CO— connecting the carbon atoms with each other, and the hydrocarbon group or the aromatic group may have an amino group), $C_4HO_3—R^{11}$ and $C_4H_2NO_2—R^{12}$ (wherein $C_4HO_3—$ represents a maleic anhydride group, $C_4H_2NO_2—$ represents a maleimide group, and $R^{11}$ and $R^{12}$ are each independently a hydrogen atom or has 1 to 15 carbon atoms while having no hydroxyl group, includes at least one saturated or unsaturated hydrocarbon group, or further includes at least one aromatic group, and may have a bond selected from a group consisting of —COO—, —O— and —CO-connecting the carbon atoms with each other, and the hydrocarbon group or the aromatic group may have an amino group).

Preferable examples of the above monomer unit having no hydroxyl group may include the following compounds, but it is not limited thereto.

(1) (Meth)acrylates such as methyl (meth)acrylate, propyl (meth)acrylate, glycidyl (meth)acrylate, butyl (meth)acrylate, ethoxyethyl (meth)acrylate, pentyl (meth)acrylate, tetrahydrofurfuryl (meth)acrylate, cyclohexyl (meth)acrylate, phenyl (meth)acrylate, dicyclopentadienyl (meth)acrylate, octyl (meth)acrylate, benzyl (meth)acrylate, N,N-dimethylaminoethyl (meth)acrylate, N,N-dimethylaminopropyl (meth)acrylate, and the like.

(2) Vinylesters such as vinylether acetate, vinylether butanoate, vinylether pentanate, vinylester hexanate, vinylester cyclohexanecarbonate, vinylester benzonate, vinylester cyclopentadienyl carbonate, vinylester nonanate, and the like.

(3) Vinylethers such as propyl vinylether, butyl vinylether, ethoxyethyl vinylether, glycidyl vinylether, pentyl vinylether, tetrahydrofurfuryl vinylether, cyclohexyl vinylether, phenyl vinylether, cyclopentadienyl vinylether, octyl vinylether, benzyl vinylether, 2-(vinyloxy)ethyl dimethylamine, 3-(vinyloxy)propyl dimethylamine, and the like.

(4) Vinyl derivatives such as 1-butene, 4-ethoxy-1-butene, 1-pentene, 1-hexene, vinylcyclohexane, styrene, vinyltoluene, 1-nonene, 3-phenylpropene, and the like.

(5) Maleic anhydride derivatives such as maleic anhydride, methyl maleic anhydride, butyl maleic anhydride, hexyl maleic anhydride, cyclohexyl maleic anhydride, phenyl maleic anhydride, octyl maleic anhydride, and the like.

(6) Maleimide derivatives such as maleimide, methylmaleimide, ethylmaleimide, butylmaleimide, hexylmaleimide, cyclohexylmaleimide, phenylmaleimide, benzylmaleimide, octylmaleimide, and the like.

A ratio of the monomer unit having an alcoholic secondary or tertiary hydroxyl group to the monomer unit constituting the chain polymer of the present invention is 30 to 100 mol %, preferably 50 to 100 mol %, more preferably 60 to 100 mol % 60 to 100 mol %, most preferably 80 to 100 mol %, and particularly preferably 90 to 100 mol %.

In the present invention, the chain polymer may be manufactured by performing a polymerization reaction using a common radical polymerization catalyst such as 2,2'-azobisisobutyronitrile (AIBN) and using a raw material monomer thereof by a conventional method. The chain polymer preferably has a molecular weight in a range of 10,000 to 100,000 (measured by gel filtration chromatography), but it is not particularly limited to this range.

As a cross-linking agent in the curable resin composition of the present invention, a triazine cross-linking agent or a glycoluril cross-linking agent is preferably used. Preferred specific examples of these cross-linking agents may include fully or partially alkoxy (e.g. methoxy, or ethoxy)-methylated melamine, fully or partially alkoxy (e.g. methoxy, or ethoxy)-methylated guanamine, fully or partially alkoxy (e.g. methoxy, or ethoxy)-methylated acetoguanamine, fully or partially alkoxy-methylated benzoguanamine, and fully or partially alkoxy (e.g. methoxy, or ethoxy)-methylated glyceryl. Herein, the "alkoxy" preferably has 1 to 4 carbon atoms. As such cross-linking agents, more specifically, for example, hexamethoxymethyl melamine, hexaethoxymethyl melamine, tetramethoxymethylmethylol melamine, tetramethoxymethyl melamine, hexabutoxymethyl melamine, tetramethoxymethyl guanamine, tetramethoxymethyl acetoguanamine, tetramethoxymethyl benzoguanamine, trimethoxymethyl benzoguanamine, tetraethoxymethyl benzoguanamine, tetramethylol benzoguanamine, 1,3,4,6-tetrakis (methoxymethyl)glycoluril, 1,3,4,6-tetrakis (butoxymethyl)glycoluril, and the like may be used, but it is not limited thereto.

In the present invention, the curable resin composition may be diluted to an appropriate concentration by a solvent. As long as there is no problem in forming a uniform coating film by applying the curable resin composition to a substrate such as a substrate made of glass and then drying the same due to significantly low or high boiling point, a commonly used non-proton solvent may be appropriately selected and used. For example, propylene glycol monomethyl ether is a suitable solvent, but it is not limited thereto. Dilution by the solvent is performed for handling convenience during the polymerization reaction of the monomer, or application of the curable resin composition added with the cross-linking agent or catalyst, such that there is no particular upper limit or lower limit on a dilution degree.

In the curable resin composition according to an embodiment of the present invention, a weight ratio of the chain polymer to the cross-linking agent may be, for example, 1:0.05 to 1:2, and preferably 1:0.5 to 1:2.

In the present embodiment, the separation layer 20 is applied to a carrier substrate 10, then an electrode pattern layer, etc. is formed thereon. Finally, the separation layer 20 is separated from the carrier substrate 10.

When separating the separation layer 20 from the carrier substrate 10, a peel-off strength is preferably 1 N/25 mm or less, and more preferably 0.1 N/25 mm or less. That is, it is preferable that the separation layer 20 is made of a material so that a physical force applied thereto does not exceed 1 N/25 mm, and particularly 0.1 N/25 mm, when the separation layer 20 and the carrier substrate 10 are separated from each other.

When separating the separation layer 20 from the carrier substrate 10, if the peel-off strength exceeds 1 N/25 mm, the separation layer 20 may remain on the carrier substrate since it is not cleanly separated from the carrier substrate, and cracks may occur at one or more places of the separation layer 20, a protective layer 30, an electrode pattern layer 40, and an insulation layer 50.

Particularly, the peel-off strength of the separation layer 20 is more preferably 0.1 N/25 mm or less. That is, it is more preferable in an aspect that, when the peel-off strength is 0.1 N/25 mm or less, curl generated in the film after peeling-off from the carrier substrate is controlled. The curl does not cause problems in terms of the function of the film touch sensor, but it is advantageous to minimize an occurrence of the curl, since the process efficiency in an adhering process, a cutting process, and the like may be deteriorated.

Herein, the thickness of the separation layer 20 is preferably 10 to 1000 nm, and more preferably 50 to 500 nm. If the thickness of the separation layer 20 is less than 10 nm, uniformity of the separation layer during the application may be deteriorated, thereby the electrode pattern may be unevenly formed, or tearing may occur due to the locally increased peel-off strength, and there is a problem that the curl is not controlled after the separation layer is separated from the carrier substrate. If the thickness thereof exceeds 1000 nm, the peeling-off strength may not be further decreased, and flexibility of the film may be deteriorated.

As another embodiment of the present invention, the separation layer 20 may not be separated from the carrier substrate 10. In this case, the present invention provides a structure for a film touch sensor, in which the carrier substrate 10 is attached to one surface of the separation layer 20.

Meanwhile, the electrode pattern layer 40 is formed on a top of the separation layer 20. The separation layer 20 functions as a cover layer for covering the electrode pattern layer 40 after separating from the carrier substrate, or functions as a protective layer for protecting the substrate 40 from external contact.

At least one protective layer 30 may be further formed on the top of the separation layer 20. Since it may be difficult to protect the electrode pattern against the external contact or impact only by the separation layer 20, one or more protective layers 30 may be formed on the separation layer 20

The protective layer 30 may include at least one of an organic insulating film or an inorganic insulating film, and may be formed by a method of coating and curing or deposition.

The protective layer may be formed except for a portion in which a pad electrode is to be formed, or the portion in which the pad electrode is to be formed may be removed for the circuit connection. In addition, a pad pattern layer may be formed on a bottom of the pad electrode. In order to form the pad pattern layer, the protective layer may be formed by applying the curable resin composition and patterning so as to cover the entire top of the separation layer, or may be formed by applying the composition except for the portion in which the pad electrode is to be formed.

The electrode pattern layer 40 is formed on the top of the separation layer 20 or the protective layer 30. The electrode pattern layer 40 includes a sensing electrode (SE) for sensing whether a touch is executed, and a pad electrode (PE) formed at one end of the sensing electrode. Herein, the sensing electrode may include not only an electrode for sensing a touch but also a wiring pattern connected to the sensing electrode.

The pad pattern layer may be formed on the top or bottom of the pad electrode. The pad electrode may be electrically connected to the circuit board through the pad pattern layer, and serves to decrease a contact resistance during connecting with the circuit board. When the circuit board is adhered in a direction of the insulation layer, the pad pattern layer may be formed on the pad electrode, and when the circuit board is adhered in a direction of the separation layer, the pad pattern layer may be formed on the bottom of the pad electrode. When the pad electrode has a sufficient decreased contact resistance during contacting with the circuit board, the pad pattern layer may be omitted.

The pad pattern layer may be made of one or more materials selected from metal, metal nanowires, metal oxides, carbon nanotubes, graphene, conductive polymers, and conductive ink.

The electrode pattern layer 40 may be made of one or more materials selected from metal, metal nanowires, metal oxides, carbon nanotubes, graphene, conductive polymers, and conductive ink.

Herein, the metal may be any one of gold (Au), silver (Ag), copper (Cu), molybdenum (Mo), aluminum, palladium, neodymium, and a silver-palladium-copper alloy (APC).

In addition, the metal nanowire may be any one of silver nanowire, copper nanowire, zirconium nanowire, and gold nanowire.

Further, the metal oxide may be any one of indium tin oxide (ITO), indium zinc oxide (IZO), indium zinc tin oxide (IZTO), aluminum zinc oxide (AZO), gallium zinc oxide (GZO), fluorine tin oxide (PTO), zinc oxide (ZnO), indium tin oxide-silver-indium tin oxide (ITO-Ag-ITO), indium zinc oxide-silver-indium zinc oxide (IZO-Ag-IZO), indium zinc tin oxide-silver-indium zinc tin oxide (IZTO-Ag-IZTO) and aluminum zinc oxide-silver-aluminum zinc oxide (AZO-Ag-AZO).

Further, the electrode pattern layer 40 may be made of carbon-based materials including carbon nanotube (CNT) and graphene.

The conductive polymer may include polypyrrole, polythiophene, polyacetylene, PEDOT, and polyaniline, and may be made of such a conductive polymer.

The conductive ink is an ink in which metal powders and a curable polymer binder are mixed, and an electrode may be made of using the ink.

Figure 2A:
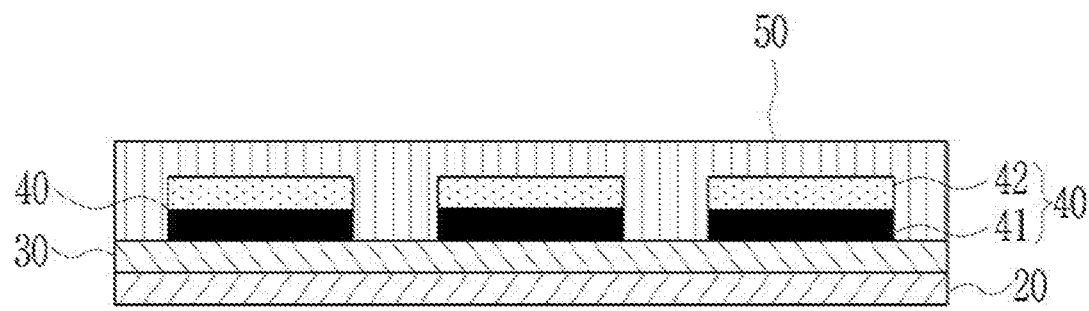

Optionally, the electrode pattern layer 40 may be formed of two or more conductive layers in a form of a first electrode layer 41 and a second electrode layer 42 as illustrated in FIG. 2A, in order to reduce the electrical resistance.

Figure 2B:
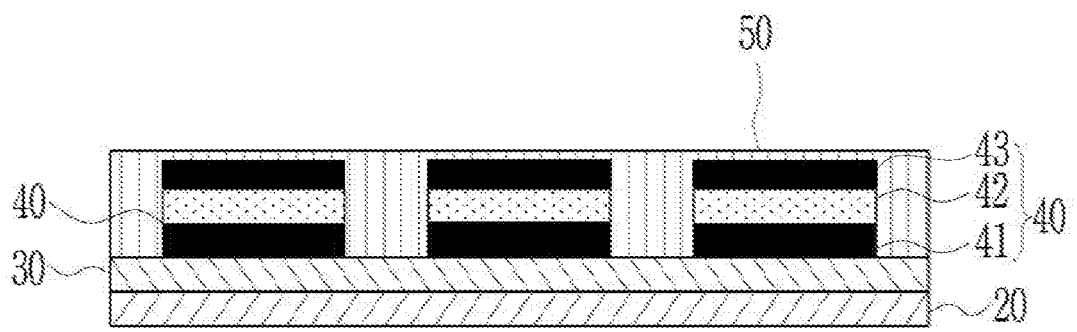

The electrode pattern layer 40 may be formed of one layer using ITO, silver nanowire (AgNW), or metal mesh. When forming two or more layers, the first electrode layer 41 may be made of transparent metal oxides such as ITO, and the second electrode layer 42 may be formed on a top of the ITO electrode layer using metal or AgNW in order to further reduce the electrical resistance. If necessary, the electrode pattern layer 40 may further include a third electrode layer 43 formed on the second electrode layer 42 as illustrated in FIG. 2B using the transparent metal oxide such as ITO.

In order to improve electrical conductivity of the electrode pattern layer 40, it is possible to form the layer by including at least one electrode pattern layer made of metal or metal oxide. More specifically, the electrode pattern layer may be prepared by forming a conductive layer using metal or metal oxide on the separation layer or the protective layer, and then further forming an electrode pattern by laminating a transparent conductive layer, or otherwise, after one or more of the transparent conductive layers are laminated on the separation layer or the protective layer, a conductive layer may be further formed using metal or metal oxide to form an electrode pattern. Specific examples of the lamination structure of the electrode pattern are as follows. A structure in which metal or metal oxide pattern layer is further formed between the separation layer and the electrode pattern layer; a structure in which metal or metal oxide pattern layer is further formed between the electrode pattern layer and the insulation layer; a structure in which metal or metal oxide pattern layer is further formed between the protective layer and the electrode pattern layer, and may further include one or more of electrode pattern layers made of transparent conductive materials.

Specific examples of the lamination structure of the applicable electrode pattern layer 40 are as follows:

A structure in which metal oxide is laminated and silver nanowire is laminated thereon; a structure in which metal oxide is laminated and metal is laminated thereon; a structure in which metal oxide is laminated and a metal mesh electrode is laminated thereon; a structure in which silver nanowire is laminated and metal oxide is laminated thereon; a structure in which metal is laminated and metal oxide is laminated thereon; a structure in which a metal mesh electrode is laminated and metal oxide is laminated thereon; a structure in which metal oxide is laminated, silver wire is laminated thereon, and metal or metal oxide is further laminated thereon; a structure in which silver nanowire is laminated, metal oxide is laminated thereon, and a metal layer is further laminated thereon. The electrode lamination structure may be changed in consideration of signal processing and resistance of the touch sensor, and it is not limited the above-described lamination structure.

The electrode pattern layer may include an electrical insulation layer formed between the first electrode pattern layer and the second electrode pattern layer, and the electrical insulation layer may be patterned to form a contact hole, thereby the second conductive layer may be formed so as to be a bridge electrode.

In addition, the structure of the electrode pattern layer will be described in terms of the touch sensor manner.

The pattern structure of the electrode pattern layer is preferably an electrode pattern structure used in a capacitive type, and a mutual-capacitance type or a self-capacitance type may also be applied thereto.

In a case of the mutual-capacitance type, it may be a lattice electrode structure having a horizontal axis and a vertical axis. Bridge electrodes may be formed at intersections of the electrodes on the horizontal axis and the vertical axis, or alternatively, a horizontal axis electrode pattern layer and a vertical axis electrode pattern layer may be formed with being electrically separated from each other.

In a case of the self-capacitance type, it may be an electrode layer structure in which a change in capacitance is read using one electrode at each point.

An insulation layer 50 is formed on the top of the electrode pattern layer 40. The insulation layer may serve to prevent corrosion of the electrode pattern and protect the surface of the electrode pattern. It is preferable that the insulation layer 50 is formed to have a constant thickness by filling gaps between the electrodes or the wirings.

That is, a surface opposite to the surface in contact with the electrode pattern layer 40 is preferably formed flat so as not to expose concavo-convexes of the electrode.

Herein, the insulation layer 50 may be formed so as to expose at least a portion of the pad electrode portion to provide a space in which the pad electrode or the pad pattern layer is connected to the circuit board, and may be formed so as to cover all the sensing electrode to protect the sensing electrode.

The protective layer 30 and the insulation layer 50 preferably have a difference in elastic modulus of 300 MPa or less at 25° C., in consideration of preventing an occurrence of cracks due to a difference in stress releasing ability for each layer. The reason of setting the difference in elastic modulus between the protective layer 30 and the insulation layer 50 to be 300 MPa or less at 25° C. is that, if the difference in elastic modulus exceeds 300 MPa, imbalance in deformation energy and the stress releasing ability between two layers may occur to generate cracks therein.

In addition, the reason of measuring the difference in elastic modulus at 25° C. is that cracks should not be generated in an environment of using products by a user.

As a material for the insulation layer is not particularly limited so long as it is an organic insulating material satisfying a difference in elastic modulus with the protective layer of 300 Mpa or less, but it is preferable that the insulation layer includes a UV-curable organic polymer. The insulation layer may be made of at least one material selected from materials such as epoxy compounds, acrylic compounds, melamine compounds, and the like.

Further, the insulation layer may be made of at least one material selected from a curable prepolymer, a curable polymer and a plastic polymer in terms of the material form.

The insulation layer 50 itself may serve as an optical film. In this case, it is preferable that the film is made of a varnish type material that can form a film, and the varnish type material may include at least one material selected from polysilicon or polyimide material such as polydimethylsiloxane (PDMS), polyorganosiloxane (POS), and polyurethane materials such as spandex.

In addition, the insulation layer 50 may be made using an inorganic material such as silicon oxide (SiOx), and may be formed by methods such as deposition, sputtering, and the like.

In the film touch sensor of the present invention, the pad electrode may be electrically connected with the circuit board.

The circuit board may be a flexible printed circuit board (FPCB), as an example, and functions to electrically connect the touch control circuit and the film touch sensor of the present invention with each other.

The circuit board may include an electrode formed at one end thereof corresponding to the pad electrode, and the pad electrode and the circuit board may be electrically connected with each other by a conductive bonding agent. In addition, the film touch sensor may be connected with the circuit board through at least partially opened region of an upper part of the pad electrode, or may be connected with the circuit board through the separation layer. The pad pattern layer made of a material having a low resistance may be formed on the top or bottom of the pad electrode. In this case, the circuit board may be connected with the pad electrode through the pad pattern layer.

Figure 3:
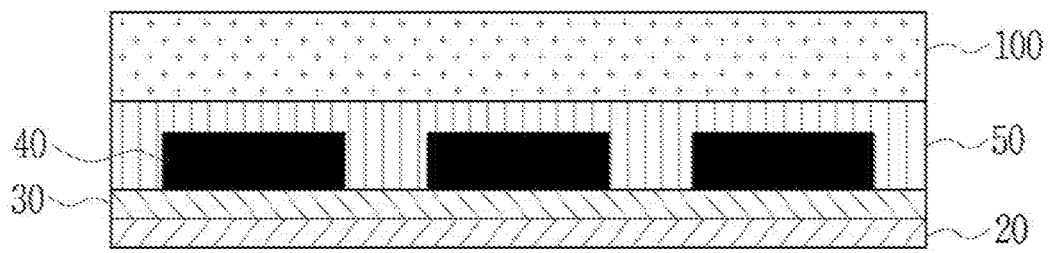

A film touch sensor according to another embodiment of the present invention may include, as illustrated in FIG. 3, a separation layer; an electrode pattern layer which is formed on the separation layer, and includes a sensing electrode and a pad electrode formed on one end of the sensing electrode; an insulation layer formed on a top of the electrode pattern layer so as to cover a part or all of the electrode pattern layer; and an optical film directly formed on the insulation layer.

The insulation layer 50 itself may function as an adhesive layer including an adhesive agent or a bonding agent. The insulation layer may be made of one or more materials selected from a group consisting of polyester, polyether, polyurethane, epoxy, silicone and acrylic resins. In addition, when the insulation layer 50 functions as an adhesive layer, an optical film 100 may be directly adhered to a top of the insulation layer 50.

Herein, the optical film 100 may be a transparent film or a polarizing plate.

Films having excellent properties such as transparency, mechanical strength, and thermal stability may be used as the transparent film. Specific examples may include a film prepared of a polyester resin such as polyethylene terephthalate, polyethylene isophthalate, polyethylene naphthalate, polybutylene terephthalate, etc.; a cellulose resin such as diacetyl cellulose, triacetyl cellulose, etc.; a polycarbonate resin; an acryl resin such as polymethyl (meth)acrylate, polyethyl (meth)acrylate, etc.; a styrene resin such as polystyrene, acrylonitrile-styrene copolymer, etc.; a polyolefin resin such as polyethylene, polypropylene, a polyolefin having a cyclo- or norbonene structure, ethylene-propylene copolymer, etc.; a vinyl chloride resin; an amide resin such as nylon, an aromatic polyamide, etc.; an imide resin; a polyethersulfone resin; a sulfone resin; a polyetheretherketone resin; a polysulfide phenylene resin; a vinyl alcohol resin; a vinylidene chloride resin; a vinylbutyral resin, an allylate resin; a polyoxymethylene resin; an epoxy resin, and the like. Additionally, a film including a blend of the above thermoplastic resins may also be used. Alternatively, a film prepared of a thermosetting resin such as (meth)acryl, urethane, acrylurethane, epoxy or silicon resins, etc. or UV-curable resins may be used. Although the thickness of such a transparent film may be suitably determined, the transparent film generally has a thickness of about 1 to 500 μm in terms of workability such as a strength or handling properties, and thin layer properties. Particularly, the transparent film preferably has a thickness of 1 to 300 μm, and more preferably 5 to 200 μm.

The transparent protective film described above may include at least one suitable additive. The additive may include, for example, UV-absorbers, antioxidants, lubricants, plasticizers, releasing agents, anti-coloring agents, flame retardants, nucleating agents, antistatic agents, pigments, colorants, and the like. The transparent film may have a structure including various functional layers such as a hard coating layer, an antireflection layer, and a gas barrier layer on one surface or both surfaces of the film. The functional layer is not limited to the above-described layers, and the transparent film may include various functional layers depending on an application.

Optionally, the transparent film may be surface treated. Such a surface treatment may include a drying process such as plasma processing, corona treatment, primer processing, etc., or chemical treatment such as alkalization including saponification.

Further, the transparent film may be an isotropic film, a retardation film or a protective film.

When the transparent film is the isotropic film, an in-plane retardation (Ro, Ro=[nx−ny]×d], nx and ny represent a main refractive index of a film plane (in-plan refractive index), and d represents a thickness of the film) is 40 nm or less, and preferably, 10 nm or less, and a retardation in a thickness direction (Rth, Rth=[(nx+ny)/2−nz]×d, nx and ny represent the main refractive index of the film plane, nz represents a refractive index in a thickness direction of the film, and d represents the thickness of the film) ranges from −90 nm to +75 nm, preferably, −80 nm to +60 nm, and more preferably, −70 nm to +45 nm.

The retardation film is a film fabricated by processes including mono-axial stretching or biaxial stretching of a polymer film, polymer coating, and liquid crystal coating, and is generally used to enhance and control optical characteristics such as compensation for a viewing angle, enhancement of color sensitivity, enhancement of light leakage, control of a color taste in a display.

Types of the retardation film include a wave plate of ½ or ¼ wavelength, a positive C plate, a negative C plate, a positive A plate, a negative A plate, and a biaxial wave plate.

The protective film may be a film in which an adhesive layer is formed on at least one surface of a film made of a polymer resin or a film having self-adhesion such as polypropylene, and may be used to protect a surface of the film touch sensor and enhance workability.

Any known polarizing plate used in the display panel may be used as the polarizing plate.

Specifically, a polarizing plate prepared by stretching a polyvinyl alcohol film to dispose a protective layer on at least one surface of a polarizer dyed with iodine or a dichroic dye, a polarizing plate prepared by aligning liquid crystals so as to have performance of the polarizer, and a polarizing plate prepared by coating an alignment resin such as polyvinyl alcohol to the transparent film, and stretching and dyeing the same may be used, but it is not limited thereto.

Figure 4:
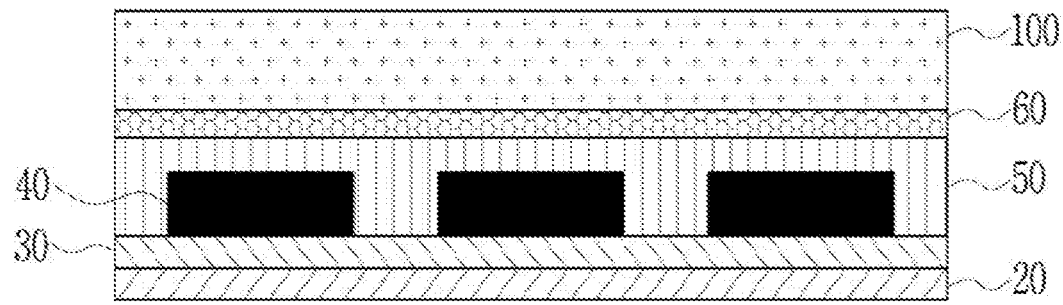

A film touch sensor according to another embodiment of the present invention may include, as illustrated in FIG. 4, a separation layer; an electrode pattern layer which is formed on the separation layer, and includes a sensing electrode and a pad electrode formed on one end of the sensing electrode; an insulation layer formed on a top of the electrode pattern layer so as to cover a part or all of the electrode pattern layer; an adhesive layer formed on the insulation layer; and an optical film directly formed on the insulation layer.

The film touch sensor may further include an optical film on the top of the insulation layer 50. In this case, a separate adhesive layer 60 may be formed between the insulation layer 50 and the optical film 100 so as to bond these layers. The adhesive layer 60 is made of an adhesive agent or a bonding agent, and may use either a thermosetting type or a UV curing type.

The bonding agent or the adhesive agent used for adhering the optical film 100 is preferably a polyester, polyether, polyurethane, epoxy, silicone, or acrylic material.

Hereinafter, a process of manufacturing the film touch sensor according to the present invention having the above-described structure will be described with reference to FIGS. 5A to 5F.

FIGS. 5A to 5F are cross-sectional views illustrating processes of a method for manufacturing the film touch sensor according to a first embodiment of the present invention, and the method for manufacturing the film touch sensor according to the present invention will be described in detail with reference to these drawings.

Figure 5A:
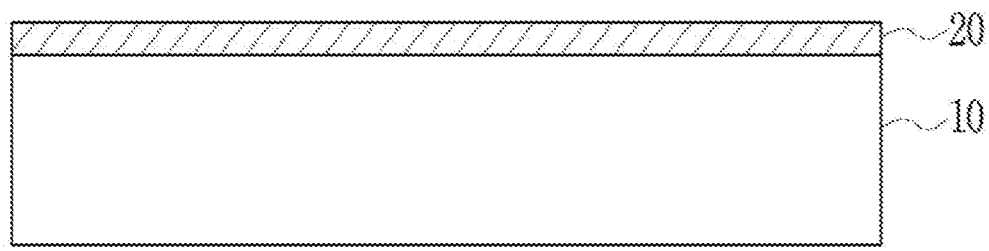
FIGS. 5A to 5F are cross-sectional views illustrating processes of a method for manufacturing a film touch sensor according to a first embodiment of the present invention.

As illustrated in FIG. 5A, first, a chain polymer including a side chain having an alcoholic secondary or tertiary hydroxyl group and a cross-linking agent are mixed, then the mixture is applied to the carrier substrate 10 to form a separation layer 20.

Specifically, (a) the side chain is made of a curable resin composition which has 3 to 30 carbon atoms, includes at least one saturated or unsaturated hydrocarbon group, or further includes at least one aromatic group, and has a bond selected from a group consisting of —COO—, —O—, and —CO-connecting the carbon atoms with each other.

If necessary, (b) the cross-linking agent may be made of a curable resin composition selected from a triazine cross-linking agent and a glycoluril cross-linking agent.

As a method of applying the separation layer, coating methods known in the related may be used.

For example, spin coating, die coating, spray coating, roll coating, screen coating, slit coating, dip coating, gravure coating, and the like may be used.

The curing process for forming the separation layer 20 may be performed using thermal curing or UV curing alone, or a combination of the thermal curing and UV curing.

It is preferable to use a glass substrate as the carrier substrate 10, but it is not limited to the glass substrate, and other substrates may be used as the carrier substrate 10. However, it is preferable to use a material which has heat resistance so as not to be deformed even at a high temperature, that is, maintains flatness so as to withstand the process temperature during forming the electrode.

Figure 5B:
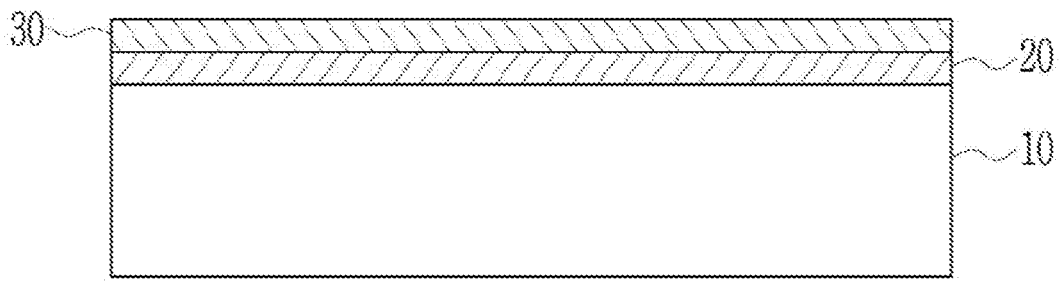

Then, as illustrated in FIG. 5B, a protective layer 30 is formed by applying an organic insulation layer on the separation layer 20 formed on the carrier substrate 10.

In the protective layer 30, the organic insulation layer may be applied except for a portion in which the pad pattern layer is to be formed, or the portion in which the pad electrode is to be formed may be removed by a method such as patterning in order to form a pad pattern layer for the circuit connection. In addition, the pad pattern layer for connection with the circuit board may be formed at a portion in which the protective layer is not formed. In the present embodiment, a case of having no pad pattern layer will be described.

Next, an electrode pattern layer is formed on the protective layer 30. In the present embodiment, a case in the electrode pattern layer has a single-layer laminate structure will be described.

Figure 5C:
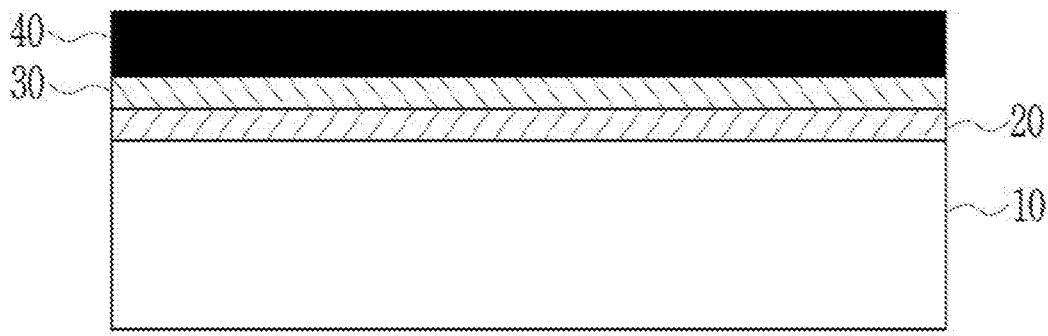
Figure 5D:
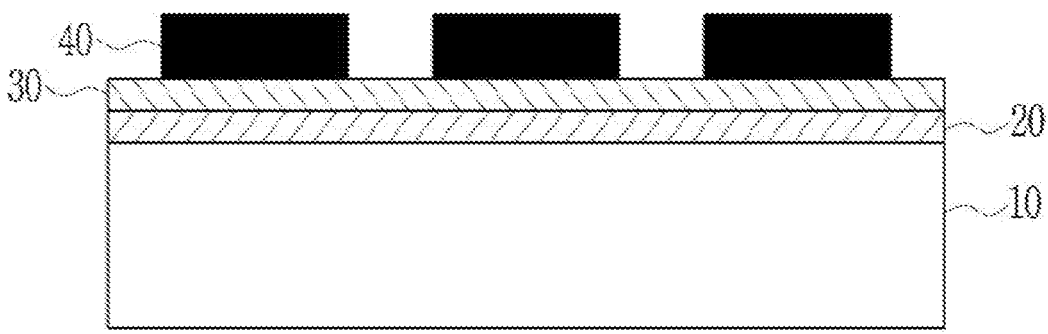

First, as illustrated in FIG. 5C, an ITO transparent electrode layer is formed as a transparent conductive layer, and a photosensitive resist (not illustrated) is formed thereon. Thereafter, selective patterning is performed through a photolithography process to form an electrode pattern layer 40 as illustrated in FIG. 5D.

The transparent conductive layer may be formed by a sputtering process such as chemical vapor deposition (CVD), physical vapor deposition (PVD) or plasma enhanced chemical vapor deposition (PECVD), a printing process such as screen printing, gravure printing, reverse offset, ink jet, and dry or wet plating process. In a case of forming a film by the sputtering process, a mask having a desired electrode pattern shape may be disposed on the substrate, and the sputtering process may be performed to form the electrode pattern layer. In addition, a conductive layer may be formed on the entire surface by the above-described film forming method, and an electrode pattern may be formed by photolithography.

The photosensitive resist may be a negative type photosensitive resist or a positive type photosensitive resist. After completing the patterning process, the photosensitive resist may remain on the electrode pattern layer 40 as necessary, or may be removed. In the present embodiment, a structure in which the positive type photosensitive resist is used to remove the same from the electrode pattern after completing the patterning process will be described.

Figure 5E:
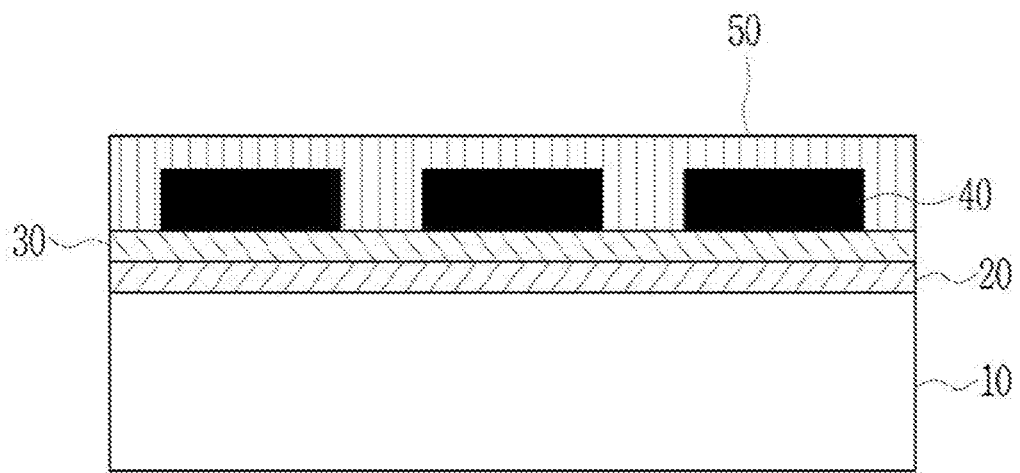

Next, an insulation layer 50 is formed so as to cover the electrode pattern layer 40 as illustrated in FIG. 5E. The thickness of the insulation layer 50 is set to be equal to or greater than that of the electrode so that the upper surface of the insulation layer has a flat form. That is, an insulating material having appropriate viscoelasticity should be used so that the concavo-convexes of the electrodes are not transferred thereto.

Specifically, a liquid material to be an insulation layer is applied to the top of the electrode pattern layer and an insulation layer is formed through a film formation step.

Herein, as a method of applying the insulation layer, any coating method known in the related art may be used.

For example, spin coating, die coating, spray coating, roll coating, screen coating, slit coating, dip coating, gravure coating, and the like may be used.

The film formation of the insulation layer may be performed by at least one method for thermal curing, UV curing, thermal drying, vacuum drying, and may be selected according to the properties of the insulation layer material.

The insulation layer itself may function as a support. In this case, since the insulation layer functions as an optical film, it is not necessary to attach an optical film.

If the top surface of the insulation layer is not flat, the optical film may not function due to the concavo-convexes of the insulation layer. If an additional optical film is attached to the top of the insulation layer, problems, in which uniform bonding is impossible and the performance of the touch sensor is deteriorated, may occur.

Herein, the insulation layer 50 is formed so as to expose at least a portion of the pad electrode portion to provide a space in which the pad electrode or the pad pattern layer is connected with the circuit board, and so as to cover all the sensing electrode to protect the sensing electrode.

As a method for forming the insulation layer 50 so as to expose the pad electrode, there are a method of applying the liquid material so as to cover the top of the electrode pattern layer and patterning the same to form the insulation layer, and a method of applying the liquid material except for the pad electrode region so as to expose the pad electrode to form the insulation layer.

The pad pattern layer may be formed after the insulation layer is formed. In the present embodiment, a structure of having no pad pattern layer will be described.

In the method for manufacturing a film touch sensor of the present invention after the formation step of the insulation layer, the steps of (a) attaching an optical film onto the insulation layer, (b) adhering the electrode pattern layer and the circuit board with each other, and (c) separating the separation layer from the carrier substrate to remove the carrier substrate may be carried out in an arbitrary order.

Specific methods of carrying out one or more steps selected from the above steps (a), (b) and (c) will be described separately below.

Figure 5F:
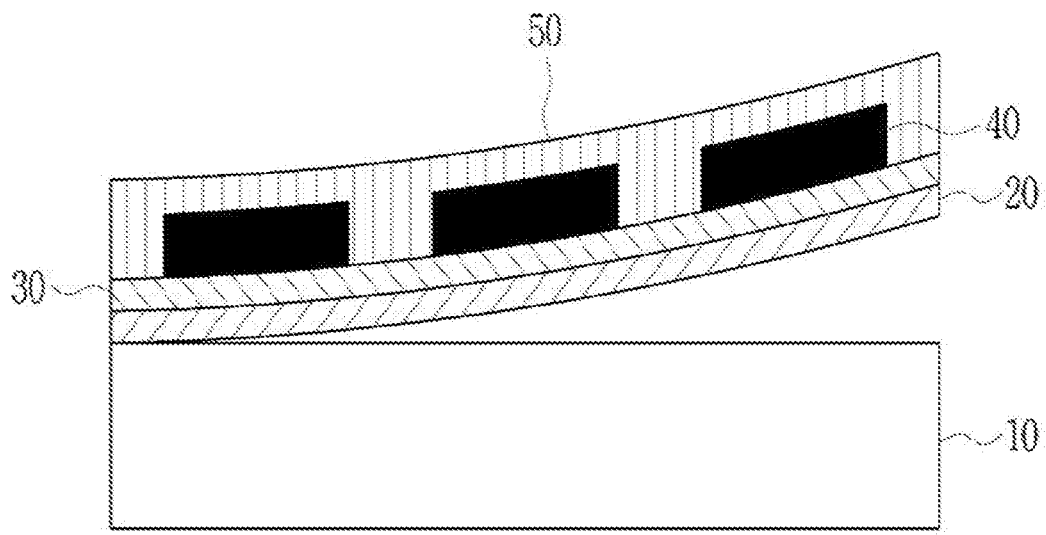

After the insulation layer is formed, as illustrated in FIG. 5F, the separation layer 20 having the electrodes formed thereon is separated from the carrier substrate 10 used to perform the manufacturing process of the touch sensor.

In the present invention, the separation layer 20 is separated from the carrier substrate 10 by using a method of peeling-off therefrom.

The method of peeling-off the separation layer may be a lift-off method or a peel-off method, but it is not limited thereto.

In this case, a magnitude of the force applied during peeling-off may depend on the peel-off strength of the separation layer, but it is preferably 1 N/25 mm or less, and more preferably 0.1 N/25 mm or less. If the peel-off strength exceeds 1 N/25 mm, a problem that the film touch sensor is torn during peeling-off from the carrier substrate may occur, and the film touch sensor may be deformed due to an excessive force applied to the film touch sensor, whereby it may not function as a device.

Next, the film touch sensor and the circuit board may be adhered to each other. At this time, the film touch sensor may be adhered to the circuit board using a conductive bonding agent.

The conductive bonding agent refers to a material in which conductive fillers such as silver, copper, nickel, carbon, aluminum, or plating are dispersed in a binder such as epoxy, silicone, urethane, acrylic or polyimide resin.

The circuit board may be adhered before or after separating the carrier substrate and the touch sensor from each other.

When adhering the circuit board before separating the touch sensor from the carrier substrate, the laminate structure may be formed so that a part of the pad electrode is exposed in at least one of the insulation layer application step, the insulation layer film formation step and the optical film deposition step, or the laminate structure may be formed so that a part of the pad electrode is exposed via a separate patterning step. Then, the circuit board is adhered to the exposed pad electrode, and is separated from the carrier substrate. When the pad pattern layer is formed on the top of the pad electrode, the circuit board is adhered to the pad pattern layer, then the substrate is separated.

When adhering the circuit board after separating the touch sensor from the carrier substrate, the circuit board may be adhered to the pad electrode in the direction of the separation layer by passing through the separation layer, and the pad pattern layer may be formed on the bottom of the pad electrode. In this case, the circuit board is connected to the pad electrode through the pad pattern layer. Also, the circuit board may be adhered to the exposed pad electrode or the pad pattern layer in the direction of the insulation layer or optical film.

When connecting the circuit board with the pad electrode, a method of connecting the same through the pad pattern layer is for decreasing the contact resistance between the circuit board and the pad electrode, and may be selectively applied according to the manufacturing process and the product specification.

Figure 6A:
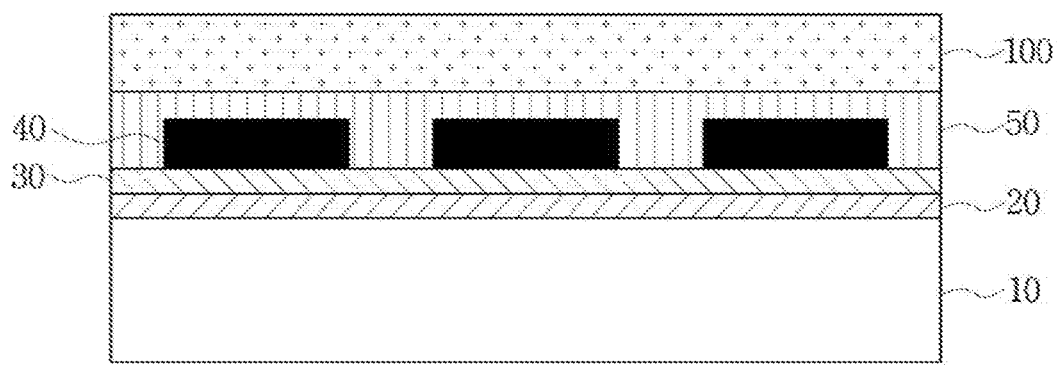
FIGS. 6A to 6B are cross-sectional views illustrating processes of a method for manufacturing a film touch sensor according to a second embodiment of the present invention.
Figure 6B:
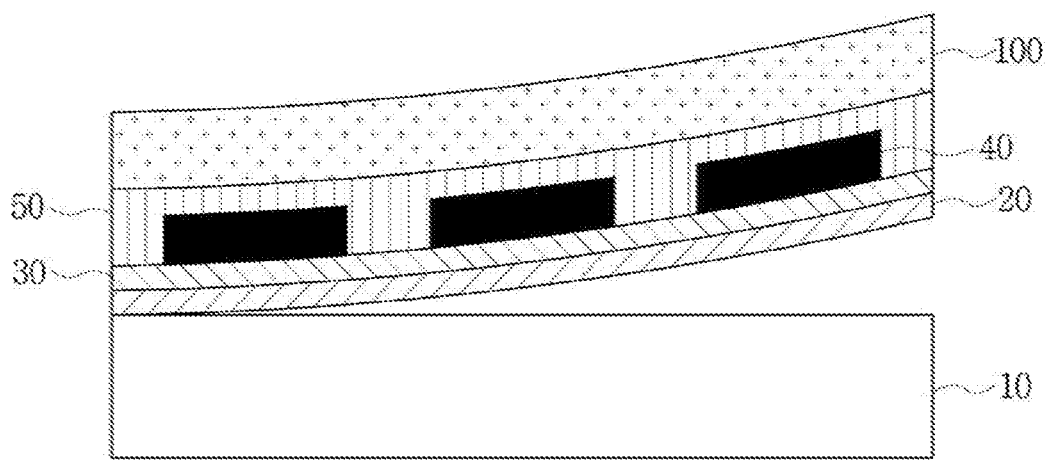

FIGS. 6A to 6B are cross-sectional views illustrating processes of a method for manufacturing a film touch sensor according to a second embodiment of the present invention. Hereinafter, the method for manufacturing a film touch sensor according to the second embodiment of the present invention will be described with reference to these drawings.

The processes of forming a separation layer 20 on the carrier substrate 10, and then forming an electrode pattern layer 40 and an insulation layer 50 are substantially the same as those of the first embodiment.

However, in the second embodiment of the present invention, an optical film 100 may be attached to the top of the insulation layer 50. Since the insulation layer has the function of the adhesive layer, as illustrated in FIG. 6A, the optical film 100 is characterized by being directly adhered to the top of the insulation layer.

As described above, in the step of adhering the optical film, attaching the optical film to the insulation layer is performed under a condition that a pressure applied to the film is 1 to 200 kg/cm$^2$, and preferably 10 to 100 kg/cm$^2$.

Then, as illustrated in FIG. 6B, the separation layer is separated from the carrier substrate 10 by using the method of peeling-off therefrom. Then, the circuit board is adhered to the pad electrode or the pad pattern layer.

Figure 7A:
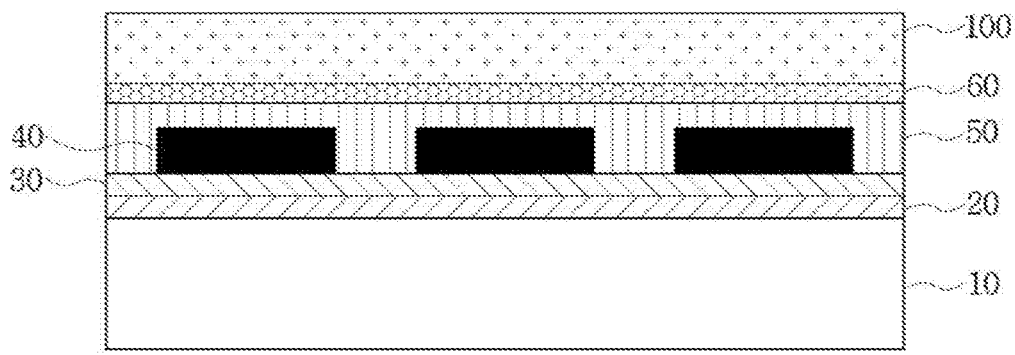
FIGS. 7A to 7B are cross-sectional views illustrating processes of a method for manufacturing a film touch sensor according to a third embodiment of the present invention.
Figure 7B:
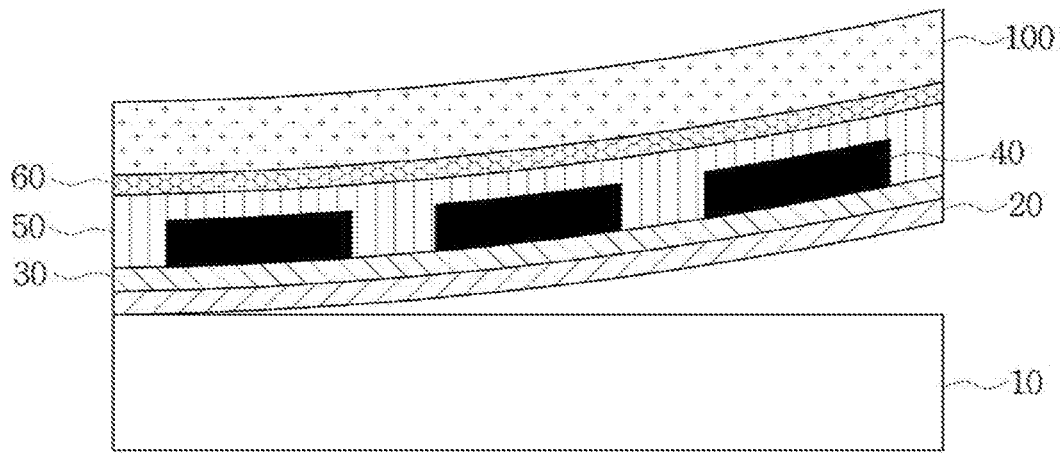

FIGS. 7A to 7B are cross-sectional views illustrating processes of a method for manufacturing a film touch sensor according to according to a third embodiment of the present invention. Hereinafter, the method for manufacturing a film touch sensor according to the third embodiment of the present invention will be described with reference to these drawings.

The method for manufacturing a film touch sensor according to the third embodiment of the present invention includes forming an insulation layer 50, then forming an adhesive layer 60 on the insulation layer 50, and attaching an optical film 100 thereto. In this case, the adhesive layer 60 may be formed by coating or adhering to one surface of the optical film 100 in advance, or an adhesive layer may be coated and bonded to an upper surface of the insulation layer, and then the optical film 100 may be attached thereto.

FIG. 7A illustrates a lamination structure in which the adhesive layer is formed on the insulation layer, then the optical film is adhered thereto.

Next, as illustrated in FIG. 7B, the separation layer is separated from the carrier substrate 10 by using the method of peeling-off therefrom. Then, the circuit board is adhered to the pad electrode or the pad pattern layer.

Figure 8:
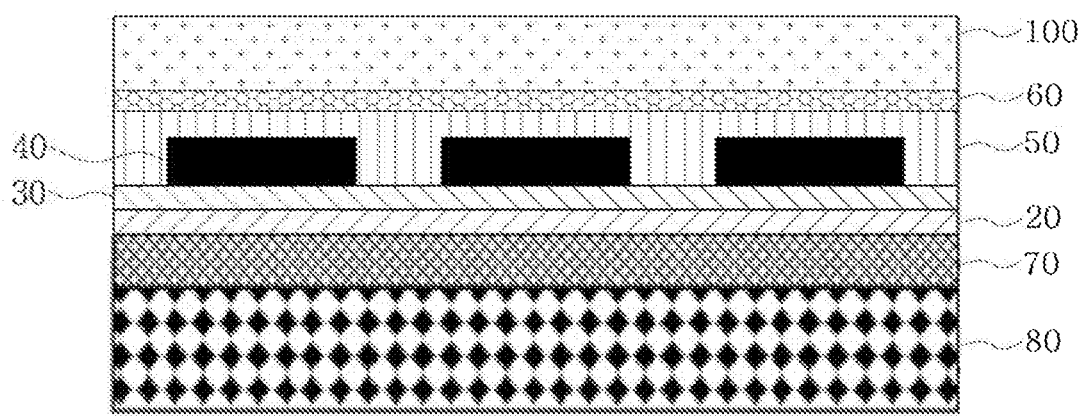
FIG. 8 is a cross-sectional view illustrating a structure of a film touch sensor according to another embodiment of the present invention.

In addition, as illustrated in FIG. 8, a film touch sensor according to another embodiment of the present invention includes a separation layer; an electrode pattern layer which is formed on the separation layer, and includes a sensing electrode and a pad electrode formed on one end of the sensing electrode; and an insulation layer formed on a top of the electrode pattern layer so as to cover a part or all of the electrode pattern layer, and may further include a functional film layer 80 formed on a surface of the separation layer opposite to the surface on which the electrode pattern layer is formed through an adhesive agent or a bonding agent.

An adhesive layer 70 may be further provided between the separation layer 20 and the functional film layer 80, and the adhesive layer 70 may be made of an adhesive agent or a bonding agent. In this case, the adhesive agent or the bonding agent may be an adhesive agent or a bonding agent known in the related art without particular limitation thereof, but the adhesive agent or the bonding agent may be at least one type of adhesive agent or bonding agent of a thermosetting type or a UV curing type.

The functional film layer 80 may use any functional film layer known in the related art without particular limitation thereof, but may be a film in which a functional coating layer is formed on a functional film or a base film, and one film or coating layer selected from a group consisting of the above film layers may be formed in a single layer or a multi-layer. For example, the functional film may be a transparent film, a retardation film, an isotropic film, a protective film, a polarizing plate, a polarizer, a barrier film, and the like. The barrier film may be a single layer film, or a multi-layered film in which at least one layer of an inorganic film and an organic film is applied to the base film. Examples of the multi-layered barrier film may include structures such as a lamination of inorganic film/cyclo-olefin polymer (COP) film/inorganic film/organic film; a lamination of inorganic film/hard coating layer/COP film/hard coating layer/inorganic film; a lamination of inorganic film/triacetyl cellulose (TAC) film/hard coating layer/inorganic film/organic film; a lamination of organic film/hard coating layer/TAC film/hard coating layer/inorganic film/organic film, and the like.

The functional coating layer may be coating layers having the same function as the above-described functional film, and may be, for example, a coating type organic film layer, a coating type retardation layer, a coating type polarizer layer, a coating type alignment film layer, and the like. In addition, any film known in the related art may be applied without particular limitation thereof, and the above-described functional film may also be used.

Meanwhile, the functional film layer 80 may be a film selected from the same group as the optical film 100, and may be used together with the optical film 100 or may be adhered to the bottom of the separation layer without the optical film 100, as necessary. Due to the above-described lamination structure, when wrapping, bending or rolling up the film touch sensor manufactured by the present invention, it is possible to provide desirable effects in terms of further protecting the electrode pattern layer 40 from external water or expansion stress applied thereto.

The adhesive layer 70 may be formed by coating or adhering to one surface of the functional film layer 80 in advance, or an adhesive layer may be coated and bonded to an upper surface of the separation layer 20, and then the functional film layer 80 may be attached thereto.

Although not described in detail in the embodiments of the present invention, an order of the processes of laminating each layer may be changed.

The film touch sensor manufactured by the present invention may be disposed and used so that the functional film layer is positioned on a viewer side when adhering to the display panel, on the other hand, the functional film layer may be disposed so as to be attached to a display panel side.

In accordance with the film touch sensor and the method for manufacturing the same according to the present invention, since the touch sensor is implemented on the carrier substrate, it is possible to secure high accuracy and heat resistance which are impossible in a process of directly implementing the touch sensor on the base film, and diversify the base film. That is, an optical film or a functional film layer having a low heat resistance may also be used because they can be adhered after forming the electrode.

In addition, the process efficiency may be increased by attaching the circuit board to the pad pattern layer before or after separating from the carrier substrate without removing the separation layer to be formed on the carrier substrate.

In addition, the protective layer having a controlled elastic modulus is formed between the separation layer and the insulation layer, such that cracks due to a difference in the stress releasing ability may be suppressed, and curl of the film touch sensor may be prevented.

As described above, preferred embodiments are proposed to more concretely describe the present invention. However, the following examples are only given for illustrating the present invention and those skilled in the related art will obviously understand that various alterations and modifications are possible within the scope and spirit of the present invention. Such alterations and modifications are duly included in the appended claims.

PREPARATIVE EXAMPLES AND SYNTHESIS EXAMPLES

1. Preparation of Polymers as a Component of Curable Resin Composition

As a component of the curable resin composition, polymers were prepared as follows.

[Preparative Example 1] Preparation of Polymer A-1

4-benzoyloxy-3-hydroxycyclohexylmethyl methacrylate represented by Formula 1-1 below was used as a monomer, and 100 parts by weight ('wt. parts') thereof was dissolved in propylene glycol monomethyl ether (PGME) so as to be an amount of 30 wt. parts. The obtained solution was heated to 80° C. while blowing a nitrogen gas thereinto, 2,2'-azobisisobutyronitrile (AIBN) was added thereto in an amount of 5 mol % to a total weight of the monomer, and then a reaction was carried out at 80° C. for 8 hours to prepare Polymer A-1. A weight average molecular weight (MW) of the prepared polymer was measured by gel filtration chromatography, and the measured result was 25,000.

[Formula 1-1]

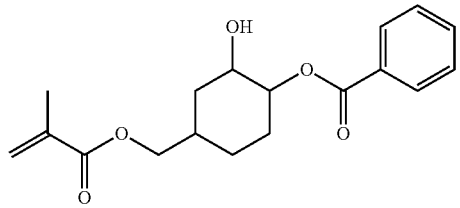

(1-1)

[Preparative Example 2] Preparation of Polymer A-2

Polymer A-2 was prepared by performing the same procedures as described in Preparative Example 1 except that 3-benzoyloxy-2-hydroxypropyl methacrylate represented by Formula 1-2 below was used as a monomer. The weight average molecular weight (MW) of the prepared polymer was measured by gel filtration chromatography, and the measured result was 22,000.

[Formula 1-2]

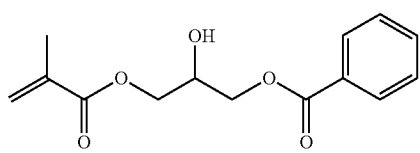

(1-2)

[Preparative Example 3] Preparation of Polymer A-3

Polymer A-3 was prepared by performing the same procedures as described in Preparative Example 1 except that 2-hydroxypropyl methacrylate represented by Formula 1-3 below was used as a monomer. The weight average molecular weight (MW) of the prepared polymer was measured by gel filtration chromatography, and the measured result was 32,000.

[Formula 1-3]

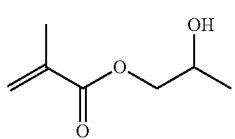

(1-3)

[Preparative Example 4] Preparation of Polymer A-4

Polymer A-4 was prepared by performing the same procedures as described in Preparative Example 1, except that 1,3-adamantyldiol monomethacrylate represented by Formula 1-4 below was used as a monomer. The weight average molecular weight (MW) of the prepared polymer was measured by gel filtration chromatography, and the measured result was 18,000.

[Formula 1-4]

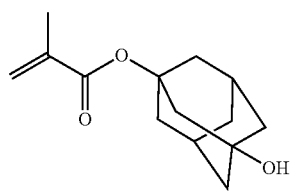

(1-4)

[Preparative Example 5] Polymer A-5

Polymer A-5 was prepared by performing the same procedures as described in Preparative Example 1 except that 2-hydroxycyclohexyl methacrylate represented by Formula 1-5 below was used as a monomer. The weight average molecular weight (MW) of the prepared polymer was measured by gel filtration chromatography, and the measured result was 36,000.

[Formula 1-5]

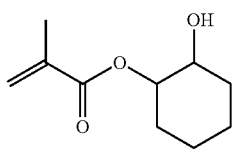

(1-5)

[Preparative Example 6] Preparation of Polymer A-6

Polymer A-6 was prepared by performing the same procedures as described in Preparative Example 1, except that 2-hydroxyethyl methacrylate represented by Formula 1-6 below was used as a monomer. The weight average molecular weight (MW) of this polymer was determined by gel filtration chromatography and found to be 42,000.

[Formula 1-6]

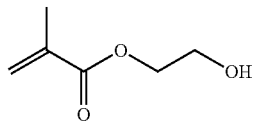

(1-6)

[Preparative Example 7] Preparation of Polymer A-7

Polymer A-7 was prepared by performing the same procedures as described in Preparative Example 1 except that 4-(hydroxymethyl) cyclohexylmethyl methacrylate represented by Formula 1-7 below was used as a monomer. The weight average molecular weight (MW) of the prepared polymer was measured by gel filtration chromatography, and the measured result was 18,000.

[Formula 1-7]

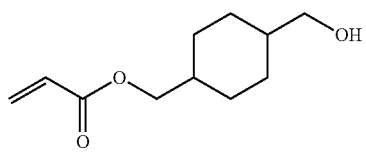

(1-7)

[Preparative Example 8] Preparation of Polymer A-8

4-benzoyloxy-3-hydroxycyclohexylmethyl methacrylate represented by Formula 1-1 below and n-butyl acrylate were used as a monomer, and each 50 wt. parts thereof was added to propylene glycol monomethyl ether (PGME) so as to be a total amount of 30 wt. parts. The obtained solution was heated to 80° C. while blowing a nitrogen gas thereinto, 2,2'-azobisisobutyronitrile (AIBN) was added thereto in an amount of 5 mol % to a total weight of the monomer, and then a reaction was carried out at 80° C. for 8 hours to prepare Polymer A-8. The weight average molecular weight (MW) of the prepared polymer was measured by gel filtration chromatography, and the measured result was 18,000.

[Preparative Example 9] Preparation of Polymer A-9

Polymer A-9 was prepared by performing the same procedures as described in Preparative Example 8 except that 4-benzoyloxy-3-hydroxycyclohexylmethyl methacrylate represented by Formula 1-1 and methyl methacrylate were used as a monomer. The weight average molecular weight (MW) of this polymer was determined by gel filtration chromatography and found to be 25,000.

[Preparative Example 10] Preparation of Polymer A-10

Polymer A-10 was prepared by performing the same procedures as described in Preparative Example 8 except that 4-benzoyloxy-3-hydroxycyclohexylmethyl methacrylate represented by Formula 1-1 and styrene were used as a monomer. The weight average molecular weight (MW) of the prepared polymer was measured by gel filtration chromatography, and the measured result was 22,000.

[Preparative Example 11] Preparation of Polymer A-11

Polymer A-11 was prepared by performing the same procedures as described in Preparative Example 8 except that 2-hydroxypropyl methacrylate represented by Formula 1-3 and dicyclopentadienyl methacrylate were used as a monomer. The weight average molecular weight (MW) of the prepared polymer was measured by gel filtration chromatography, and the measured result was 35,000.

[Preparative Example 12] Preparation of Polymer A-12

Polymer A-12 was prepared by performing the same procedures as described in Preparative Example 8 except that 2-hydroxycyclohexyl methacrylate and dicyclopentadienyl methacrylate represented by Formula 1-5 were used as a monomer. The weight average molecular weight (MW) of this polymer was determined by gel filtration chromatography and found to be 25,000.

[Preparative Example 13] Preparation of Polymer A-13

Polymer A-13 was prepared by performing the same procedures as described in Preparative Example 8 except that 2-hydroxyethyl methacrylate represented by Formula 1-6 and butyl acrylate were used as a monomer. The weight average molecular weight (MW) of the prepared polymer was measured by gel filtration chromatography, and the measured result was 38,000.

[Preparative Example 14] Preparation of Polymer A-14

Polymer A-14 was prepared by performing the same procedures as described in Preparative Example 8 except that 2-hydroxyethyl methacrylate represented by Formula 1-6 and methyl methacrylate were used as a monomer. The weight average molecular weight (MW) of the prepared polymer was measured by gel filtration chromatography, and the measured result was 36,000.

[Preparative Example 15] Preparation of Polymer A-15

Polymer A-15 was prepared by performing the same procedures as described in Preparative Example 8 except that 2-hydroxyethyl methacrylate represented by Formula 1-6 and dicyclopentadienyl methacrylate were used as a monomer. The weight average molecular weight (MW) of the prepared polymer was measured by gel filtration chromatography, and the measured result was 39,000.

2. Formation of Separation Layer

Various curable resin compositions of the present invention were prepared as follows, and the prepared compositions were applied to two types of glass substrates, followed by heating and curing the same to form a film thereon.

Synthesis Example 1

1.6 wt. parts of Polymer A-1, 3.2 wt. parts of hexamethoxymethyl melamine represented by Formula B-1 below as a cross-linking agent, and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass having a thickness of 0.7 mm and alkali-free glass having a thickness of 0.5 mm, respectively, by spin coating, and then heat-treated at 150° C. or higher for 30 minutes to form a film having a thickness of about 300 nm.

[Formula B-1]

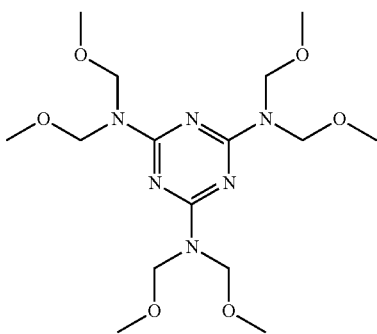

(B-1)

Synthesis Example 2

2.4 wt. parts of Polymer A-1, 2.4 wt. parts of hexamethoxymethyl melamine (Formula B-1) as a cross-linking agent and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Synthesis Example 3

3.2 wt. parts of Polymer A-1, 1.6 wt. parts of hexamethoxymethyl melamine (Formula B-1) as a cross-linking agent and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Synthesis Example 4

2.4 wt. parts of Polymer A-2, 2.4 wt. parts of hexamethoxymethyl melamine (Formula B-1) as a cross-linking agent and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Synthesis Example 5

2.4 wt. parts of Polymer A-3, 2.4 wt. parts of hexamethoxymethyl melamine (Formula B-1) as a cross-linking agent and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Synthesis Example 6

2.4 wt. parts of Polymer A-4, 2.4 wt. parts of hexamethoxymethyl melamine (Formula B-1) as a cross-linking agent, and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Synthesis Example 7

2.4 wt. parts of Polymer A-5, 2.4 wt. parts of hexamethoxymethyl melamine (Formula B-1) as a cross-linking agent and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Synthesis Example 8

2.4 wt. parts of Polymer A-8, 2.4 wt. parts of hexamethoxymethyl melamine (Formula B-1) as a cross-linking agent and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Synthesis Example 9

2.4 wt. parts of Polymer A-9, 2.4 wt. parts of hexamethoxymethyl melamine (Formula B-1) as a cross-linking agent, and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Synthesis Example 10

2.4 wt. parts of Polymer A-10, 2.4 wt. parts of hexamethoxymethyl melamine (Formula B-1) as a cross-linking agent and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Synthesis Example 11

2.4 wt. parts of Polymer A-11, 2.4 wt. parts of hexamethoxymethyl melamine (Formula B-1) as a cross-linking agent and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Synthesis Example 12

2.4 wt. parts of Polymer A-12, 2.4 wt. parts of hexamethoxymethyl melamine (Formula B-1) as a cross-linking agent and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Synthesis Example 13

2.4 wt. parts of Polymer A-1, 2.4 wt. parts of 1,3,4,6-tetrakis (methoxymethyl)glycoluril represented by Formula B-2 below as a cross-linking agent and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

[Formula B-2]

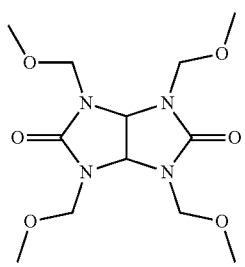

(B-2)

Synthesis Example 14

2.4 wt. parts of Polymer A-1, 2.4 wt. parts of tetramethoxymethyl benzoguanamine represented by Formula B-3 below as a cross-linking agent and 0.2 wt. parts of pyridinium p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

[Formula B-3]

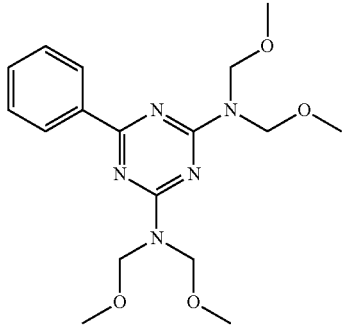

(B-3)

Synthesis Example 15

2.4 wt. parts of Polymer A-1, 2.4 wt. parts of hexamethoxymethyl melamine (Formula B-1) as a cross-linking agent and 0.2 wt. parts of laurylbenzenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Synthesis Example 16

2.4 wt. parts of Polymer A-1, 2.4 wt. parts of hexamethoxymethyl melamine (Formula B-1) as a cross-linking agent and 0.2 wt. parts of a thermal acid generator, San-Aid SI-100L (Sanshin Chemical Industries, Co., Ltd.) as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Synthesis Example 17

4 wt. parts of Polymer A-1, 0.8 wt. parts of hexamethoxymethyl melamine (Formula B-1) as a cross-linking agent and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Synthesis Example 18

4.36 wt. parts of Polymer A-1, 0.44 wt. parts of hexamethoxymethyl melamine (Formula B-1) as a cross-linking agent and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Synthesis Example 19

4.57 wt. parts of Polymer A-1, 0.23 wt. parts of hexamethoxymethyl melamine (Formula B-1) as a cross-linking agent and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Comparative Synthesis Example 1

2.4 wt. parts of Polymer A-6, 2.4 wt. parts of hexamethoxymethyl melamine (Formula B-1) as a cross-linking agent and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Comparative Synthesis Example 2

2.4 wt. parts of Polymer A-7, 2.4 wt. parts of hexamethoxymethyl melamine (Formula B-1) as a cross-linking agent and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Comparative Synthesis Example 3

2.4 wt. parts of Polymer A-13, 2.4 wt. parts of hexamethoxymethyl melamine (Formula B-1) as a cross-linking agent and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Comparative Synthesis Example 4

2.4 wt. parts of Polymer A-14, 2.4 wt. parts of hexamethoxymethyl melamine (Formula B-1) as a cross-linking agent and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Comparative Synthesis Example 5

2.4 wt. parts of Polymer A-15, 2.4 wt. parts of hexamethoxymethyl melamine (Formula B-1) as a cross-linking agent and 0.2 wt. parts of pyridinium-p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Comparative Synthesis Example 6

2.4 wt. parts of Polymer A-1, 2.4 wt. parts of Dyuranate TPA-100 (manufactured by Asahi Kasei Co., Ltd.) as an isocyanurate cross-linking agent and 0.2 wt. parts of pyridinium p-toluenesulfonic acid as a polymerization catalyst were dissolved in 95 wt. parts of propylene glycol monomethyl ether (PGME) to obtain a solution. The obtained solution was applied to soda glass and alkali-free glass, respectively, and then heat-treated similar to Synthesis Example 1 to form a film having a thickness of about 300 nm.

Examples and Comparative Examples

Organic insulation layers were applied to the separation layers prepared in Synthesis Examples 1 to 19 and Comparative Synthesis Examples 1 to 6 as a protective layer and cured, followed by depositing ITO thereon to form an electrode pattern layer using a photoresist. Next, the photoresist was applied and cured again, and a portion of the pad electrode part was exposed through a conventional photolithography process, and then polyethylene terephthalate (PET) bonded with an adhesive agent is adhered thereto using a roll laminator, thus to prepare film touch sensors of Examples 1 to 19 and Comparative Examples 1 to 6.

Experimental Example: Evaluation of Physical Properties of Separation Layers Prepared in Examples 1 to 19 and Comparative Examples 1 to 6

1. Measurement of Peel-Off Strength

Peel-off strengths during peeling-off the film touch sensors prepared in Examples 1 to 19 and Comparative Examples 1 to 6 from the glass was measured according to ASTM standard D1876, and the measured values are shown in Table 1 below. In this case, a peel-off angle was set to 90 degrees, and a peel-off rate was set to 300 mm/min.

2. Evaluation of Crack

Surfaces of the film touch sensor after peeling-off were observed by an optical microscope to determine whether cracks occur or not, and the results are shown in Table 1 below.

<Standards for Crack Evaluation>

○: No crack within 1×1 cm

Δ: 1 to 5 cracks within 1×1 cm

X: 6 cracks or more within 1×1 cm

TABLE 1

| Section | Substrate: soda glass peel-off strength (N/25 mm) | Substrate: alkali-free glass peel-off strength (N/25 mm) | Crack evaluation |
|---|---|---|---|
| Example 1 | 0.021 | 0.031 | ○ |
| Example 2 | 0.031 | 0.035 | ○ |
| Example 3 | 0.062 | 0.042 | ○ |
| Example 4 | 0.032 | 0.035 | ○ |
| Example 5 | 0.078 | 0.085 | ○ |
| Example 6 | 0.013 | 0.038 | ○ |
| Example 7 | 0.019 | 0.036 | ○ |
| Example 8 | 0.041 | 0.084 | ○ |
| Example 9 | 0.048 | 0.064 | ○ |
| Example 10 | 0.035 | 0.045 | ○ |
| Example 11 | 0.024 | 0.039 | ○ |
| Example 12 | 0.018 | 0.028 | ○ |
| Example 13 | 0.025 | 0.042 | ○ |
| Example 14 | 0.031 | 0.051 | ○ |
| Example 15 | 0.036 | 0.038 | ○ |
| Example 16 | 0.058 | 0.074 | ○ |
| Example 17 | 0.131 | 0.150 | Δ |
| Example 18 | 0.452 | 0.585 | Δ |
| Example 19 | 0.908 | 0.99 | Δ |
| Comparative Example 1 | 3.0 | 4.2 | X |
| Comparative Example 2 | 3.8 | 5.2 | X |
| Comparative Example 3 | 4.2 | 4.6 | X |
| Comparative Example 4 | 2.8 | 3.7 | X |
| Comparative Example 5 | 2.2 | 3.2 | X |
| Comparative Example 6 | 8.7 | 9.2 | X |

As shown in Table 1, as compared to the peel-off strengths of the cured resin thin films of Comparative Examples 1 to 6 were 2.2 to 8.7 N/25 mm (soda glass substrate) and 3.2 to 9.2 N/25 mm (alkali-free glass substrate), the cured resin thin films of Examples 1 to 16 had peel-off strengths of 0.013 to 0.078 N/25 mm (soda glass substrate) and 0.028 to 0.085 N/25 mm (alkali-free glass substrate), which are about 100 times smaller than the comparative examples, and the cured resin thin films of Examples 17 to 19 had peel-off strengths remarkably smaller than the comparative examples. In fact, each of the cured resin thin films of the comparative example showed a high value of peel-off strength, such that destroying of the film or the substrate were observed, while all the cured resin thin films of the examples were easily peeled-off without difficulty.

3. Evaluation of Peel-Off Strength for Cured Resin Thin Films after the Calcination A calcination process for manufacturing a circuit by patterning using photolithography or printing on the cured resin thin films was assumed, and the peel-off strengths when calcining the cured resin thin films were measured. That is, for Examples 1 and 7 and Comparative Examples 1 and 2, the cured resin thin films formed on the soda glass substrate were calcined at 230° C. for 1 hour or 3 hours, and each peel-off strength was measured by the same device and method as described in the above 1 (measurement of peel-off strength). The measured results are shown in Table 2 below together with the peel-off strength (initial peel-off strength) values before the calcination in the examples and comparative examples.

TABLE 2

| Section | Initial peel-off strength (N/25 mm) | Peel-off strength after the calcination at 230° C. for 1 hour (N/25 mm) | Peel-off strength after the calcination at 230° C. for 3 hours (N/25 mm) |
|---|---|---|---|
| Example 1 | 0.021 | 0.021 | 0.031 |
| Example 7 | 0.019 | 0.037 | 0.042 |
| Comparative Example 1 | 3.0 | 4.5 | 5.7 |
| Comparative Example 2 | 3.8 | 4.6 | 7.2 |

As shown in Table 2, the cured resin thin films of Examples 1 and 7 had peel-off strengths of about 100 times smaller than Comparative examples 1 and 2 even after performing the calcination at 230° C. for 1 hour or 3 hours, and the cured resin thin films could be easily peeled-off without difficulty. On the other hand, the cured resin thin films of Comparative Examples 1 and 2 were adhered to the glass substrate more strongly than before the calcination.

What is claimed is:

1. A film touch sensor comprising:
    a separation layer;
    an electrode pattern layer which is formed on the separation layer, and includes a sensing electrode and a pad electrode formed on one end of the sensing electrode; and
    an insulation layer formed on a top of the electrode pattern layer so as to cover a part or all of the electrode pattern layer,
    wherein the separation layer comprises a chain polymer including a side chain having an alcoholic secondary or tertiary hydroxyl group, and a cross-linking agent; and
    the side chain is made of a curable resin composition which has 3 to 30 carbon atoms, includes at least one saturated or unsaturated hydrocarbon group, or further includes at least one aromatic group, and has a bond selected from a group consisting of —COO—, —O—, and —CO— connecting the carbon atoms with each other.

2. The film touch sensor according to claim 1, wherein the chain polymer comprises, as a monomer unit including the side chain having an alcoholic secondary or tertiary hydroxyl group, at least one of a (meth)acrylate monomer, a vinylester monomer, a vinylether monomer, and other vinyl monomers in addition thereto.

3. The film touch sensor according to claim 1, wherein the chain polymer includes a monomer unit selected from a group consisting of compounds represented by formulae of $CH_2$=CH—COO—$R^1$, $CH_2$=C($CH_3$)—COO—$R^2$, $CH_2$=CH—O—CO—$R^3$, $CH_2$=CH—O—$R^4$, and $CH_2$=CH—$R^5$; and
    $R^1$, $R^2$, $R^3$, $R^4$ and $R^5$ are each independently, when they are bonded to each vinyl group through an ester bond, has 3 to 30 carbon atoms including carbon atoms constituting the ester bond, has an alcoholic secondary or tertiary hydroxyl group, includes at least one saturated or unsaturated hydrocarbon group, or further includes at least one aromatic group, and has a bond selected from a group consisting of —COO—, —O—, and —CO— connecting the carbon atoms with each other.

4. The film touch sensor according to claim 1, wherein the chain polymer includes, as an additional monomer unit, at least one of a (meth)acrylate monomer, a vinylester monomer, a vinylether monomer, which have 1 to 15 carbon atoms in the side chain while having no hydroxyl group, and other vinyl monomers in addition thereto.

5. The film touch sensor according to claim 4, wherein the additional monomer unit is selected from a group consisting of compounds represented by formulae of $CH_2$=CH—COO—$R^6$, $CH_2$=C($CH_3$)—COO—$R^7$, $CH_2$=CH—O—CO—$R^8$ (wherein $R^6$, $R^7$ and $R^8$ each independently have 1 to 15 carbon atoms while having no hydroxyl group, includes at least one saturated or unsaturated hydrocarbon group, or further includes at least one aromatic group, and has a bond selected from a group consisting of —COO—, —O— and —CO— connecting the carbon atoms with each other, and the hydrocarbon group or the aromatic group has an amino group), $CH_2$=CH—O—$R^9$, $CH_2$=CH—$R^{10}$ (wherein $R^9$ and $R^{10}$ each independently have 1 to 15 carbon atoms while having no hydroxyl group, includes at least one saturated or unsaturated hydrocarbon group, or further includes at least one aromatic group, and has a bond selected from a group consisting of —COO—, —O— and —CO— connecting the carbon atoms with each other, and the hydrocarbon group or the aromatic group has an amino group), $C_4HO_3$—$R^{11}$ and $C_4H_2NO_2$—$R^{12}$ (wherein $C_4HO_3$— represents a maleic anhydride group, $C_4H_2NO_2$— represents a maleimide group, and $R^{11}$ and $R^{12}$ are each independently a hydrogen atom or has 1 to 15 carbon atoms while having no hydroxyl group, includes at least one saturated or unsaturated hydrocarbon group, or further includes at least one aromatic group, and has a bond selected from a group consisting of —COO—, —O— and —CO— connecting the carbon atoms with each other, and the hydrocarbon group or the aromatic group has an amino group).

6. The film touch sensor according to claim 1, wherein a ratio of the monomer unit having an alcoholic secondary or tertiary hydroxyl group to the monomer unit constituting the chain polymer is 30 to 100 mol %.

7. The film touch sensor according to claim 1, wherein the cross-linking agent is selected from a triazine cross-linking agent and a glycoluril cross-linking agent.

8. The film touch sensor according to claim 1, wherein the cross-linking agent is selected from a group consisting of fully or partially alkoxy-methylated melamine, fully or partially alkoxy-methylated guanamine, fully or partially alkoxy-methylated acetoguanamine, fully or partially alkoxy-methylated benzoguanamine, and fully or partially alkoxy-methylated glycoluril.

9. The film touch sensor according to claim 1, wherein a weight ratio of the chain polymer to the cross-linking agent in the curable resin composition is 1:0.05 to 1:2.

10. The film touch sensor according to claim 1, wherein a weight ratio of the chain polymer to the cross-linking agent in the curable resin composition is 1:0.5 to 1:2.

11. The film touch sensor according to claim 1, wherein the curable resin composition includes a solvent.

12. The film touch sensor according to claim 1, further comprising a protective layer formed between the separation layer and the electrode pattern layer.

13. The film touch sensor according to claim 1, further comprising an optical film disposed on a top of the insulation layer.

14. The film touch sensor according to claim 1, wherein the electrode pattern layer is made of at least one selected from a group consisting of metal, metal nanowires, metal oxides, carbon nanotubes, graphene, conductive polymer, and a conductive ink.

15. The film touch sensor according to claim 1, further comprising a functional film layer formed on a surface of the separation layer opposite to the surface on which the electrode pattern layer is formed through an adhesive agent or a bonding agent.

16. The film touch sensor according to claim 15, wherein the functional film layer is at least one functional film selected from a group consisting of a transparent film, a retardation film, an isotropic film, a protective film, a polarizing plate, a polarizer, and a barrier film.

17. The film touch sensor according to claim 15, wherein the functional film layer is a film on which a functional coating layer is formed on a base film, and
    the functional coating layer is a coating type organic film layer, a coating type retardation layer, a coating type polarizer layer, or a coating type alignment film layer.

18. A structure including a film touch sensor, comprising:
    a carrier substrate;
    a separation layer formed on the carrier substrate;
    an electrode pattern layer which is formed on the separation layer, and includes a sensing electrode and a pad electrode formed on one end of the sensing electrode; and
    an insulation layer formed on a top of the electrode pattern layer so as to cover a part or all of the electrode pattern layer,
    wherein the separation layer comprises a chain polymer including a side chain having an alcoholic secondary or tertiary hydroxyl group, and a cross-linking agent, and
    the side chain is made of a curable resin composition which has 3 to 30 carbon atoms, includes at least one saturated or unsaturated hydrocarbon group, or further includes at least one aromatic group, and has a bond selected from a group consisting of —COO—, —O—, and —CO-connecting the carbon atoms with each other.

19. The structure according to claim 18, wherein the cross-linking agent is selected from a triazine cross-linking agent and a glycoluril cross-linking agent.

20. The structure according to claim 18, further comprising a protective layer formed between the separation layer and the electrode pattern layer.

* * * * *